US006574039B1

(12) United States Patent
Murata et al.

(10) Patent No.: US 6,574,039 B1
(45) Date of Patent: Jun. 3, 2003

(54) OPTICAL ELEMENT WITH MULTILAYER THIN FILM AND EXPOSURE APPARATUS WITH THE ELEMENT

(75) Inventors: Tsuyoshi Murata, Kanagawa (JP); Hitoshi Ishizawa, Kanagawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/856,971

(22) PCT Filed: Oct. 2, 2000

(86) PCT No.: PCT/JP00/06817

§ 371 (c)(1),
(2), (4) Date: May 30, 2001

(87) PCT Pub. No.: WO01/23914

PCT Pub. Date: Apr. 5, 2001

(30) Foreign Application Priority Data

Sep. 30, 1999 (JP) .......................................... 11-278416

(51) Int. Cl.[7] ........................... G02B 5/08; G02B 5/20; G02B 1/10; G03B 27/10

(52) U.S. Cl. ....................... 359/359; 359/355; 359/586; 355/67; 355/71

(58) Field of Search ................................ 359/359, 360, 359/350, 355, 586; 355/67, 53, 71

(56) References Cited

U.S. PATENT DOCUMENTS 5,227,839 A * 7/1993 Allen .......................... 355/53
5,514,499 A * 5/1996 Iwamatsu et al. ............. 378/34
5,532,871 A * 7/1996 Hashimoto et al. .......... 359/359
5,661,596 A * 8/1997 Biro et al. .................. 359/359
5,850,309 A * 12/1998 Shirai et al. ................ 359/360
5,993,898 A 11/1999 Nagatsuka .................. 427/162
6,243,203 B1 * 6/2001 Schleipen et al. .......... 359/581
6,310,905 B1 * 10/2001 Shirai ......................... 359/360
6,472,087 B1 * 10/2002 Otani et al. ................. 428/696

FOREIGN PATENT DOCUMENTS

| | | | |
|---|---|---|---|
| EP | 0 373 923 A2 | | 6/1990 |
| JP | A 2-158734 | | 6/1990 |
| JP | A 7-244217 | | 9/1995 |
| JP | A 10-319209 | | 12/1998 |
| JP | A 11-248903 | | 9/1999 |
| WO | WO 99/45436 | * | 9/1999 |

OTHER PUBLICATIONS

Brinker et al., "Film Formation", Sol–Gel Science; Academic Press, Inc., Sandiego, 1990, pp. 787–801.

Floch et al., "Optical Coatings Prepared From Colloidal Media", Thin Solid Films, vol. 175, 1989, pp. 173–178.

(List continued on next page.)

*Primary Examiner*—John Juba, Jr.
(74) *Attorney, Agent, or Firm*—Oliff & Berridge PLC

(57) ABSTRACT

An optical element (1) of the present invention is provided with an optical substrate (10) and a multilayered optical thin film (11–16) formed on the optical substrate (10). An $MgF_2$ layer (12, 16) of the multilayered optical thin film has a refractive index of 1.10 to 1.35, especially 1.15 to 1.25 with respect to a vacuum ultraviolet light beam having a wavelength of not more than 250 nm. Therefore, when the optical element (1) is used together with an excimer laser light beam having a wavelength of, for example, 248 nm (KrF), 193 nm (ArF), or 157 nm ($F_2$), excellent optical characteristics are exhibited concerning, for example, the reflectance (antireflection), the polarization characteristics, and the dependency on the angle of incidence. The $MgF_2$ layer (12, 16) can be produced in accordance with the sol-gel method. The optical element is preferably used for a projection lens of an exposure apparatus which uses the excimer laser light beam as a light source.

15 Claims, 18 Drawing Sheets

OTHER PUBLICATIONS

Flory, Thin Films for Optical Systems, Marcel Dekker, Inc., New York, 1995, pp. 99–115 and 132–229.

George, Preparation of Thin Films, Marcel Dekker, Inc., New York, 1992, pp. 1–5, 41–43 and 222–225.

Thomas, "Single–layer $TiO_2$ and multilayer $TiO_2$–$SiO_2$ optical coatings prepared from colloidal suspensions", Applied Optics, vol. 26, No. 21, 1987, pp. 4688–4691.

Thomas, "Method for the preparation of porous silica antireflection coatings varying in refractive index from 1.22 to 1.44", Applied Optics, vol. 31, No. 28, 1992, pp. 6145–6149.

Thomas, "Preparation of dielectric HR mirrors from colloidal oxide suspensions containing organic polymer binders", SPIE, vol. 2288, Sol Gel Optics III, 1994, pp. 50–55.

* cited by examiner

OPTICAL ELEMENT WITH MULTILAYER THIN FILM AND EXPOSURE APPARATUS WITH THE ELEMENT

TECHNICAL FIELD OF THE INVENTION

The present invention relates to an optical element such as a lens, a prism, and a reflecting mirror provided with a multilayered optical thin film on its surface. The present invention also relates to an exposure apparatus provided with the optical element as described above.

BACKGROUND ART

A variety of optical thin films such as reflection films and anti-reflection films are applied to the optical element for constructing an optical system such as a lens, a prism, and a reflecting mirror. For example, the anti-reflection film is applied in order to reduce undesirable reflection. On the other hand, the reflection film is applied to the surface of the optical element in order to efficiently reflect the incident light on the surface of the reflection film.

Such an optical thin film is generally produced in accordance with the dry process. The dry process includes the vacuum deposition, the sputtering, CVD (Chemical Vapor Deposition). The dry process is described, for example, in Joy George, Preparation of Thin Films (Marcel Dekker, Inc., New York, 1992) and Francois R. Flory, Thin Films for Optical Systems (Marcel Dekker, Inc., New York, 1995).

The anti-reflection film is required to have such performance that the reflectance is low over a wide range of angle of incidence. The reflection film is required to have such performance that the reflectance is high with satisfactory angle-dependent characteristics over a wide range of wavelength. In order to respond to the request for the performance as described above, it is known that a multilayered film is formed in a well-suited manner by combining a plurality of coating materials having different refractive indexes. Further, as for the multilayered film, it is known that the larger the difference in refractive index among a variety of coating materials to be used is, and the lower the minimum refractive index of those of the variety of coating materials is, the more the optical performance of the multilayered film is improved. Further, it is also known that the number of coating layers can be decreased by using coating materials which are greatly different in refractive index in combination, and using a coating material which has an extremely low refractive index. As a result, an optical thin film, which has high performance in relation to the light beam in the visible region, is obtained.

The integration is highly advanced and the function is highly progressive for ULSI in the exposure apparatus for semiconductors. An optical system such as a projection lens thereof is required to have a high resolution and a deep depth of focus in order to successfully obtain a machining line width of 0.18 μm. The projection lens is used to project a device pattern on a photomask onto a wafer so that the wafer is exposed therewith. The resolution and the depth of focus of the projection lens are determined by the wavelength of the light used for the exposure and N.A. (numerical aperture) of the projection lens.

In general, as for the device pattern on the photomask, the higher the definition is, the larger the angle of diffraction of the diffracted light is. Therefore, in order to perform the exposure with such a pattern, the diffracted light may be fetched by using a projection lens having large N.A. Further, the angle of diffraction of the diffracted light from the pattern is decreased when the light has a shorter wavelength λ. Therefore, it is also advantageous to use the light beam having a short wavelength for the exposure of the pattern having such a definition as described above.

The resolution and the depth of focus are represented by the following expressions respectively.

$$\text{Resolution}=k1(\lambda/N.A.) \quad (1)$$

$$\text{Depth of focus}=k2\{\lambda/(N.A.)^2\} \quad (2)$$

(In the expressions, k1 and k2 are proportional constants.)

Therefore, in order to improve the resolution (decrease the value), N.A. may be increased, or λ may be shortened. However, if N.A. is increased, the depth of focus is shortened, as appreciated from the expression of the depth of focus. When the depth of focus of the optical element such as the projection lens is shortened in the semiconductor exposure apparatus, the throughput is affected thereby. Therefore, in order to improve the resolution, it is more preferred to shorten λ rather than N.A. is increased. From such a viewpoint, the wavelength of the exposure light beam is progressively shortened, from the g-ray (436 nm) to the i-ray (365 nm) and further to the excimer laser beams such as KrF (248 nm) and ArF (193 nm).

In spite of the trend to realize the exposure with the short wavelength as described above, it has been hitherto extremely difficult to obtain a high performance optical thin film for an ultraviolet light source, for example, those used in the vicinity of 200 nm, unlike those obtained in the visible region, because of the following reason. That is, many coating materials absorb the light in this wavelength region, resulting in light loss. The coating material, which can be used in the ultraviolet region in the vicinity of 200 nm as described above, is extremely restricted. Therefore, it is difficult to sufficiently increase the difference in refractive index between the coating materials as described above, and it is difficult to extremely decrease the minimum refractive index of those of various coating materials. Therefore, it has been hitherto extremely difficult to design and produce a high performance optical thin film to be used in such a wavelength region.

At present, it is possible to use a variety of anti-reflection film materials in order to produce a typical anti-reflection film to be used for the light in the visible region by means of the dry process. In general, in the visible region, $TiO_2$ (n=2.4 to 2.7 at 500 nm) is used as the maximum refractive index material, and $MgF_2$ (n=1.38 at 500 nm) is used as the minimum refractive index material (n represents the refractive index). However, only a few coating materials are usable for the ultraviolet light having the wavelength in the vicinity of 200 nm. In general, the refractive index n is about 1.7 (n=about 1.7) in relation to the wavelength of 200 nm for any one of $LaF_2$, $NdF_3$, and $GdF_3$. These materials are usable coating materials having the maximum refractive index. The refractive index n is 1.36 (n=1.36) in relation to the wavelength of 200 nm for $Na_3AlF_6$. This material is a usable coating material having the minimum refractive index. Therefore, the difference in refractive index among a plurality of coating materials used for the light at the wavelength of 200 nm is by far smaller than the difference in refractive index among a plurality of coating materials used for the light in the visible region.

The coating material, which is usable in the ultraviolet region, is extremely limited as described above. Therefore, those skilled in the art will understand the fact that the design and the production of the optical thin film are more difficult in the ultraviolet region than in the visible region.

It is known that the optical thin film is produced in accordance with the wet process. For example, a thin film can be produced by means of hydrolysis and polymerization with a metal alkoxide solution, i.e., a liquid. The wet process is called "sol-gel process". As well-known in the art, for example, $SiO_2$, $ZrO_2$, $HfO_2$, $TiO_2$, and $Al_2O_3$ can be produced not only by the dry process but also by the sol-gel process. The method is disclosed, for example, in Ian M. Thomas, Applied Optics Vol. 26, No. 21 (1987) pp. 4688–4691 and Ian M. Thomas, SPIE Vol. 2288 Sol Gel Optics III (1994) pp. 50–55. In the case of the $SiO_2$ film formed by the sol-gel process, a colloidal $SiO_2$ suspension, which is appropriate to manufacture the $SiO_2$ film, is usually prepared by means of hydrolysis of silicon alkoxide in base alcohol as a solvent. Hydrolysis of tetraethyl silicate in ethanol can be represented, for example, by the following formula (3).

$$Si(OC_2H_5)_4+2H_2O \rightarrow SiO_2+4C_2H_5OH \quad (3)$$

This reaction is complicated, in which characteristics of the product are affected by various parameters including, for example, the catalyst, the water ratio, and the temperature. Usually, three types of the liquid coating methods, i.e., the spin coat method, the dipping method, and the meniscus method are used to execute the wet process coating. The dipping method is suitable for a large-sized substrate having an irregular configuration or a curved surface. The spin coat method is suitable for a small-sized substrate having a round configuration, a flat surface, or a gentle curvature. The meniscus method is especially suitable for a large-sized flat surface substrate. These techniques are disclosed, for example, in "Sol-Gel Science; Academic Press, Inc., Sandiego, 1990" written by Brinker and Sherer and "Thin Solid Films, Vol. 175 (1989) pp. 173–178" by Floch, Priotton et al.

When the wet process as described above is used, it is possible to obtain any one of a film having a high filling density and a film having a low filling density. In order to obtain a film having a high filling density equivalent to the film formed by the dry process, by means of the wet process, it is generally required to heat the film at a high temperature (for example, not less than 450° C.) in the production step. This requirement involves such a fear that not only the extension of the production time and the increase in production cost but also the damage and the deterioration of the substrate may be caused. Therefore, the wet process is disadvantageous as compared with the dry process. On the other hand, the wet process such as the sol-gel process is performed at the room temperature or at a temperature of not more than 150° C. Therefore, it is unnecessary to perform any additional step such as the heating step at a high temperature. Accordingly, it is easy to successfully obtain a film having a low filling density.

The present inventors have disclosed, in Japanese Laid-Open Patent Publication No. 10-319209 (U.S. Pat. No. 5,993,898 corresponding thereto), a method for producing an anti-reflection film and a reflection film in which an optical thin film formed by the wet process and a thin film formed by the wet process are used in combination. In this method, the film having a low refractive index, which is not obtained as a film formed by the ordinary dry process, can be formed in accordance with the wet process. Further, the film, which has a high refractive index, can be formed in accordance with the dry process. Therefore, it is possible to form a multilayered thin film which has a large difference in refractive index among multilayered films and which has a low refractive index layer with an extremely low refractive index.

In general, the thin film can be recognized as a model of a structural body in which a plurality of minute pores are separated from each other by a solid substance. Therefore, the relationship between the filling density and the refractive index of the film is represented as follows.

$$n_f = n_0 \times p + n_p \times (1-p) \quad (4)$$

In this expression, $n_p$ represents the refractive index of the substance (for example, air or water) with which the minute pores are filled, $n_f$ and $n_0$ represent the actual refractive index (depending on the filling density) and the refractive index of the deposited solid material respectively, and p represents the filling rate of the film. Further, the filling rate is defined as follows.

$$p = (\text{volume of solid portion of film})/(\text{total volume of film}) \quad (5)$$

In this expression, the total volume of the film corresponds to the total sum of the volume of the solid portion of film and the volume of the minute pore portion of the film.

Accordingly, the high filling density and the low filling density mean the high refractive index and the low refractive index respectively. In the case of the $SiO_2$ film produced by the wet process, the filling rate can be varied from 1 to about 0.5. Therefore, the refractive index can be changed in the visible region from 1.45 to 1.22. As a result, a monolayer anti-reflection layer, which has a reflectance of almost 0%, can be formed on the optical glass by using the wet process $SiO_2$ having the low filling density. As for the monolayer anti-reflection layer, the reflectance can be approximately 0% in the case of the perpendicular incidence. However, the monolayer anti-reflection layer involves such a problem that the reflectance is increased in the case of the oblique incidence.

It is generally known that ammonia is added as a catalyst to the hydrolysis reaction represented by the formula (3) described above, as a method for producing an $SiO_2$ film having a low filling density and a high purity in which the refractive index is 1.22 that is low in the visible region. Owing to the catalytic action of ammonia, it is possible to prepare a suspension including minute spherical $SiO_2$ particles having a high purity. This suspension is applied onto the substrate surface, and the alcohol solvent is evaporated at the room temperature. Accordingly, it is possible to prepare a porous $SiO_2$ film composed of spherical $SiO_2$ particles, i.e., an $SiO_2$ film having a low filling density. As well-known in the art, the anti-reflection film, which is composed of the $SiO_2$ film having the low filling density, has high durability against the laser. Therefore, the anti-reflection film is used, for example, for the high output laser such as those used for the nuclear fusion. This technique is described in Ian M. Thomas, Applied Optics Vol. 31, No. 28 (1992) pp. 6145–6149.

DISCLOSURE OF THE INVENTION

An object of the present invention is to solve the problems involved in the conventional technique as described above and provide an optical element such as a lens, a prism, and a reflecting mirror which can be used in the ultraviolet region of not more than 300 nm and which is provided with a high performance multilayered optical thin film, especially, a multilayered anti-reflection film or a multilayered reflection film. Another object of the present invention is to provide a projection exposure apparatus which is provided with the optical element as described above.

Still another object of the present invention is to provide an optical element provided with a multilayered antireflection film in which the reflectance is low over a wide range of angle of incidence and the difference in reflection characteristic is small irrelevant to the direction of polarization. Still another object of the present invention is to provide an optical element provided with a multilayered reflection film which has a reflectance of not less than 97% for any one of the p-polarization and the s-polarization over a wide wavelength region in the case of oblique incidence.

Still another object of the present invention is to provide a multilayered thin film-equipped optical element which is used together with a light beam in an ultraviolet region of not more than 300 nm, especially in a wavelength region of not more than 250 nm in which N.A.≧0.80 (not less than 0.8) is satisfied, and a high resolution exposure apparatus provided with the optical element as described above.

According to a first aspect of the present invention, there is provided an optical element comprising:

an optical substrate; and a multilayered optical thin film which is formed on the optical substrate, wherein:

a refractive index of at least one layer of the multilayered optical thin film with respect to a light beam having a wavelength of not more than 250 nm is not more than 1.35.

In the optical element of the present invention, the refractive index of at least one layer for constructing the multilayered optical thin film with respect to the light beam having the wavelength of not more than 250 nm is an extremely low refractive index, i.e., not more than 1.35. Accordingly, it is possible to increase the difference in refractive index among a plurality of thin films. Therefore, even when the optical element is used with the light beam having the wavelength of not more than 250 nm, i.e., the light beam having the short wavelength including, for example, those at 248 nm (KrF), 193 nm (ArF), and 157 nm ($F_2$) as the oscillation wavelength of the excimer laser, the optical element exhibits satisfactory values for optical characteristics such as the reflectance (anti-reflection), the polarization characteristic, and the dependency on the angle of incidence.

The refractive index of the at least one layer of the multilayered optical thin film with respect to the light beam having the wavelength of not more than 250 nm is preferably 1.10 to 1.35, and especially preferably 1.15 to 1.25.

The at least one layer of the optical element of the present invention may be formed by using the wet process. Especially, when the at least one layer is formed by means of the sol-gel method, a thin film having a low filling rate, i.e., a low refractive index is obtained. Therefore, this procedure is advantageous. The at least one layer is preferably composed of fluoride of alkaline earth metal or an oxide of silicon. Especially, an $MgF_2$ layer is preferred.

The multilayered optical thin film, which is formed on the optical element of the present invention, may be an anti-reflection film or a reflection film. When the multilayered optical thin film is used as the anti-reflection film, it is desirable that the anti-reflection film has a reflectance of not more than 0.5 with respect to light beams having short wavelengths of not more than 250 nm, including, for example, wavelengths of 157 nm, 193 nm, and 248 nm, provided that the angle of incidence is not more than 55 degrees. The reflectance referred to herein means an average value of reflectances for the s-polarized light and the p-polarized light. The optical element such as a lens of N.A.≧0.80 has a high curvature. Therefore, it is advantageous to form such an anti-reflection film on the surface of the optical element, because a low reflectance is exhibited over a wide range of angle of incidence. Further, when the multilayered thin film is used as an anti-reflection film, the reflectance is preferably not more than 0.3%, especially preferably not more than 0.2% with respect to the light beam having the wavelength of not more than 250 nm including, for example, wavelengths of 157 nm, 193 nm, and 248 nm, provided that the angle of incidence is not more than 55 degrees.

When the multilayered optical thin film is used as a reflection film, it is desirable that the reflectance is not less than 97% with respect to the light beam having a wavelength of 193 nm.

It is preferable that the optical element of the present invention is used together with an ultraviolet light beam having a wavelength of not more than 300 nm, preferably not more than 250 nm, and more preferably not more than 200 nm. In this case, it is preferable that the optical substrate of the optical element is formed of fluorite or quartz glass.

Typically, the optical element is, for example, a lens, a prism, or a reflecting mirror. Especially, the optical element is preferably used for a projection lens to be used for a projection exposure apparatus for performing exposure with a minute pattern based on the use of an ultraviolet light beam as described above, especially for a projection lens which satisfies N.A. (numerical aperture)≧0.80.

According to a second aspect of the present invention, there is provided an exposure apparatus for exposing a substrate with an image of a pattern on a mask, the exposure apparatus comprising:

an illumination optical system which illuminates the mask with a vacuum ultraviolet light beam;

a projection optical system which includes an optical element and which projects the image of the pattern on the mask onto the substrate; and a multilayered optical thin film which is formed on a surface of the optical element, wherein:

a refractive index of at least one layer of the multilayered optical thin film with respect to a light beam having a wavelength of not more than 250 nm is not more than 1.35.

According to a third aspect of the present invention, there is provided an exposure apparatus for exposing a substrate with an image of a pattern on a mask, the exposure apparatus comprising:

an illumination optical system which includes an optical element and which illuminates the mask with a vacuum ultraviolet light beam;

a projection optical system which projects the image of the pattern on the mask onto the substrate; and a multilayered optical thin film which is formed on a surface of the optical element, wherein:

a refractive index of at least one layer of the multilayered optical thin film with respect to a light beam having a wavelength of not more than 250 nm is not more than 1.35.

Each of the exposure apparatuses according to the second and third aspects of the present invention is provided with the optical element in which the multilayered optical thin film including the layer having the refractive index of not more than 1.35 with respect to the light beam having the wavelength of not more than 250 nm is formed on the surface. Therefore, the optical characteristics such as the reflection and the anti-reflection of the optical element are satisfactory when the vacuum ultraviolet light beam, especially the light beam having the wavelength of not more than 250 nm is used as the light beam for the exposure. As a result, it is possible to highly accurately expose the substrate with the fine mask pattern.

It is preferable for the exposure apparatus that the multilayered optical thin film is an anti-reflection film, and the anti-reflection film has a reflectance which is not more than 0.5% with respect to the light beam having a wavelength selected from the group consisting of wavelengths of 157 nm, 193 nm, and 248 nm, provided that an angle of incidence is not more than 50 degrees.

It is desirable for the exposure apparatus according to the third aspect that the projection optical system includes at least one projection lens, a multilayered optical thin film is formed on a surface of the projection lens, and a refractive index of at least one layer of the multilayered optical thin film with respect to a light beam having a wavelength of not more than 250 nm is not more than 1.35.

In the exposure apparatus according to the present invention, the optical element of the projection optical system may be a projection lens or a reflecting plate. When the projection optical system is provided with the reflecting plate such as a mirror, the multilayered thin film may function as a reflection film. When the projection optical system is provided with the projection lens, the multilayered thin film may function as an anti-reflection film. In the case of the latter, the projection optical system usually includes a plurality of projection lenses. It is advantageous that the multilayered thin film according to the present invention is applied to the lens disposed at the position closest to the light-outgoing side (wafer side). The exposure apparatus, to which the present invention is applicable, includes arbitrary projection exposure apparatuses such as the full field exposure apparatus, the scanning type projection exposure apparatus, and the mirror projection type exposure apparatus.

BEST MODE FOR CARRYING OUT THE INVENTION

Figure 1:
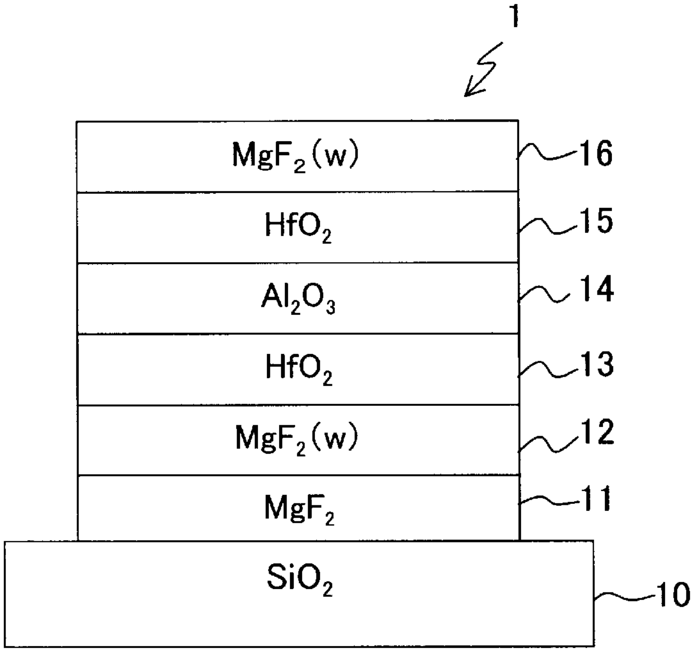
FIG. 1 shows a film structure according to a first embodiment of the present invention.

Typically, both of a film formed by the wet process and a film formed by the dry process are used in combination for the multilayered optical thin film to be applied to the optical element according to the present invention. The refractive index at 248 nm of the thin film formed by the dry process is exemplified by $MgF_2$=1.40 and $SiO_2$=1.49. On the other hand, the thin film formed by the wet process successfully realizes an extremely low value of not more than n=1.35, for example, $MgF_2$=1.16 and $SiO_2$=1.20. It is possible to obtain a high performance optical thin film capable of being used in a wavelength region of not more than 300 nm.

One or more layers of thin films based on the wet process may be used. It is advantageous to form the multilayered optical thin film by combining the thin films based on the wet process with the films based on the dry process. The multilayered optical thin film of the present invention may be used, for example, for the anti-reflection, the reflection, the sharp cut, the band pass, and the polarization. The function of the multilayered optical thin film of the present invention is not specifically limited. However, the multilayered optical thin film of the present invention is applied especially preferably to the anti-reflection film having the anti-reflection function and the reflection film having the reflection function.

The material for the film based on the wet process is not specifically limited. However, preferred examples include films of silicon oxide ($SiO_2$) and films of fluoride of alkaline earth metal such as films of magnesium fluoride ($MgF_2$).

As for the wet process, in the case of the silicon oxide ($SiO_2$) film, it is preferable to use the sol-gel process based on the hydrolysis of the metal alkoxide solution as described above. When the magnesium fluoride ($MgF_2$) film is formed, it is preferable to use the three types of reaction processes described below.

(i) Hydrofluoric acid/magnesium acetate method:

$$2HF+Mg(CH_3COO)_2 \rightarrow MgF_2+2CH_3COOH \quad (6)$$

(ii) Hydrofluoric acid/alkoxide method:

$$2HF+Mg(C_2H_5O)_2 \rightarrow MgF_2+2C_2H_5OH \quad (7)$$

(iii) Trifluoroacetic acid/alkoxide method:

$$2CF_3COOH+Mg(C_2H_5O)_2 \rightarrow Mg(CF_3COO)_2+2C_2H_5OH \quad (8a)$$

$$Mg(CF_3COO)_2 \rightarrow \text{thermal decomposition} \rightarrow MgF_2 \quad (8b)$$

A preferred method is adopted in the processes described above, in which a sol solution is prepared, and then an organo-thermal treatment or a hydro-thermal treatment is performed as a pretreatment. In this procedure, one of or both of the pressurization and the heating aging may be performed. Details of the wet method are disclosed in U.S. Pat. No. 5,835,275. This patent document is incorporated herein by reference as long as the domestic laws and ordinances of the designated state permit the incorporation. Those usable as the method for applying the sol solution to the substrate include any one selected from the spin coat method, the dipping method, the meniscus method, the spray coat method, and the printing method, optionally in combination. The heating is optionally performed after applying the sol solution, and thus organic matters are removed to form the film.

Those usable as the dry process include the vacuum deposition method, the sputtering method, the ion plating, and CVD.

The material for the substrate of the multilayered optical thin film of the optical element of the present invention is not specifically limited provided that the material is optical glass. However, for example, in the case of the multilayered anti-reflection film in which the transmitted light is used, it is preferable to use, for example, synthetic quartz glass and fluorite. The optical thin film of the present invention is preferably applied to the optical element including, for example, lenses, prisms, and filters based on the use of the materials as described above. Such an optical element improves the optical performance of the optical system in which the optical element is incorporated. Further, such an optical element improves the performance of the optical apparatus which is provided with the optical system as described above.

Explanation will be made below with reference to the drawings for embodiments of the optical element equipped with the multilayered optical thin film of the present invention, and the exposure apparatus provided with the optical element. However, the present invention is not limited thereto.

First Embodiment

In the first embodiment, a six-layered anti-reflection film for the KrF excimer laser light beam (wavelength: 248 nm) was produced. First to sixth layers of thin films were formed on a synthetic quartz glass substrate 10. Table 1 and FIG. 1 show the film arrangement and the cross-sectional view of the anti-reflection film respectively. The surrounding medium for the anti-reflection film is air. The synthetic quartz substrate 10 has a refractive index of 1.51 at 248 nm.

The first layer 11 was an $MgF_2$ layer having a refractive index of 1.40 with respect to the light beam at the wavelength of 248 nm and an optical thickness (optical length of the layer' thickness) of 104 nm (0.42-fold of the designed central wavelength $\lambda_0$), and it was formed in accordance with the dry process.

The second layer 12 was an $MgF_2$ layer having a refractive index of 1.16 with respect to the light beam at the wavelength of 248 nm and an optical thickness of 18 nm (0.07-fold of the designed central wavelength $\lambda_0$), and it was formed in accordance with the wet process. The third layer 13 was an $HfO_2$ layer having a refractive index of 2.28 with respect to the light beam at the wavelength of 248 nm and an optical thickness of 21 nm (0.08-fold of the designed central wavelength $\lambda_0$), and it was formed in accordance with the dry process. The fourth layer 14 was an $Al_2O_3$ layer having a refractive index of 1.73 with respect to the light beam at the wavelength of 248 nm and an optical thickness of 74 nm (0.30-fold of the designed central wavelength $\lambda_0$), and it was formed in accordance with the dry process. The fifth layer 15 was an $HfO_2$ layer having a refractive index of 2.28 with respect to the light beam at the wavelength of 248 nm and an optical thickness of 15 nm (0.06-fold of the designed central wavelength $\lambda_0$), and it was formed in accordance with the dry process. The sixth layer 16 was an $MgF_2$ layer having a refractive index of 1.16 with respect to the light beam at the wavelength of 248 nm and an optical thickness of 74 nm (0.30-fold of the designed central wavelength $\lambda_0$), and it was formed in accordance with the wet process. The designed central wavelength $\lambda_0$ is the wavelength to serve as the reference for designing the film thickness, and 248 nm was selected in this case. In FIG. 1 (and other drawings as well), it is indicated that the layer affixed with (W) was formed in accordance with the wet method.

As described above, the anti-reflection film includes the second layer and the sixth layer as the uppermost layer which are formed in accordance with the wet process. The $MgF_2$ thin film based on the wet process was produced in accordance with the hydrofluoric acid/magnesium acetate method represented by the formula (6) described above. Specifically, magnesium acetate was dissolved in methanol to prepare a solution. After that, hydrofluoric acid was added dropwise to this solution so that the stoichiometric ratio was obtained to prepare a sol solution. Subsequently, the sol solution was aged by performing a high temperature heating treatment (organo-thermal treatment) under a condition of a temperature of about 150° C. and a pressure of 150 kgf/$cm^2$ in an autoclave. The sol solution thus obtained was composed of methanol, fine particles of magnesium fluoride, a minute amount of $H_2O$ originating from hydrofluoric acid, and acetic acid as byproduct. Subsequently, the sol solution was spin-coated on the first layer, followed by being dried to form the second layer thereby. The sixth layer was also formed on the fifth layer in accordance with the same method as described above.

The dry process was used to form the first, third, fourth and fifth layers. In the dry process, substances ($Al_2O_3$, $HfO_2$, $SiO_2$, $MgF_2$) for forming the respective layers were heated and evaporated (subjected to the EB vapor deposition) in vacuum respectively by being irradiated with an electron beam to form the films.

TABLE 1

| Layer number | Film substance | Refractive index (248 nm) | Optical thickness/nm |
|---|---|---|---|
| 10 | substrate: quartz glass | | |
| 11 | dry $MgF_2$ | 1.40 | 104.4 |
| 12 | wet $MgF_2$ | 1.16 | 18.2 |
| 13 | dry $HfO_2$ | 2.28 | 20.6 |
| 14 | dry $Al_2O_3$ | 1.73 | 74.2 |
| 15 | dry $HfO_2$ | 2.28 | 15.4 |
| 16 | wet $MgF_2$ | 1.16 | 74.3 |

Figure 2:
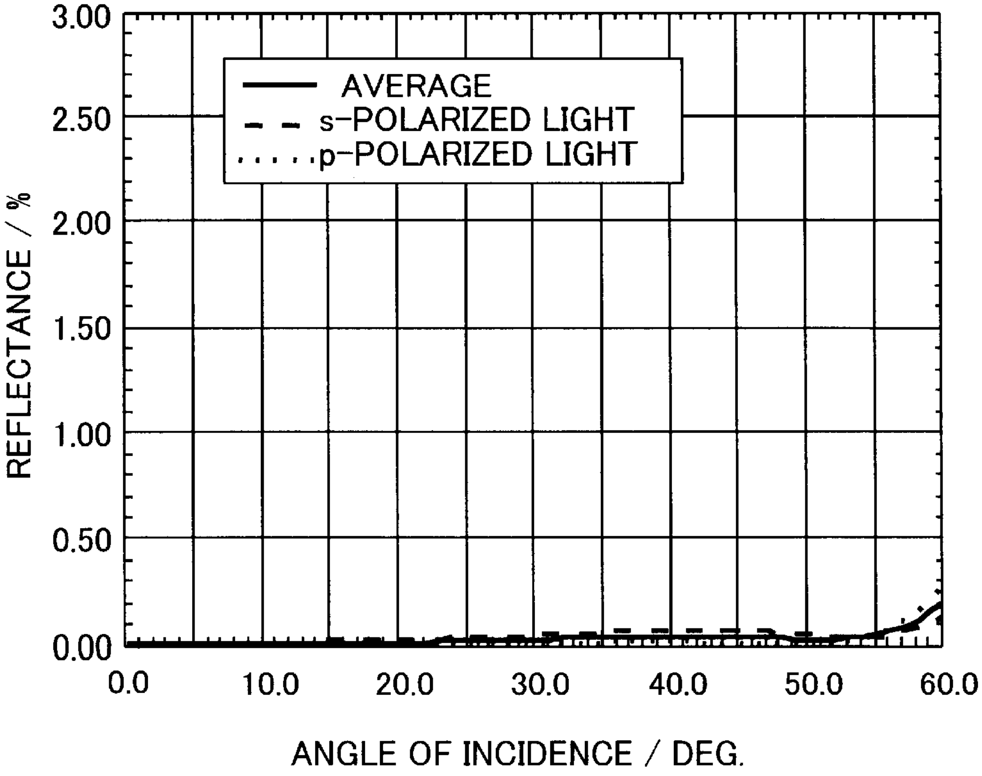
FIG. 2 shows results of measurement of angle-dependent characteristics of the reflectance obtained for the film structure according to the first embodiment.

The reflection characteristics of the anti-reflection film 1 obtained as described above were investigated as follows. The anti-reflection film was irradiated with the s-polarized light and the p-polarized light at the wavelength of 248 nm at a variety of angles of incidence to measure the change of the reflectance with respect to the angle of incidence. Obtained results of the measurement are shown in FIG. 2. An average value of reflectances for the s-polarized light and the p-polarized light is also shown in FIG. 2. As clarified from FIG. 2, although the anti-reflection film of the present invention has the relatively small number of layers, i.e., six layers, any one of the reflectances for the s-polarized light and the p-polarized light and the average reflectance thereof was not more than 0.1% in a range of the angle of incidence from 0 degree (perpendicular incidence) to 56 degrees. That is, the difference in reflectance, which is caused by the difference in polarization direction, is extremely small. It should be noted that the characteristic, in which the reflection is favorably low and the reflection does not depend on the direction of polarization, is still maintained at an angle of incidence of 60 degrees exceeding 56 degrees.

Second Embodiment

Figure 3:
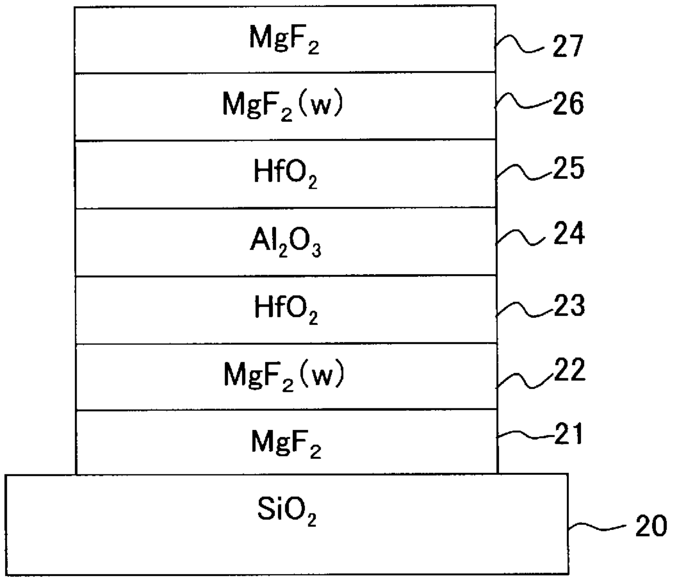
FIG. 3 shows a film structure according to a second embodiment of the present invention.

In the second embodiment, a seven-layered anti-reflection film for the KrF excimer laser light beam (wavelength: 248 nm) was produced. The film arrangement is shown in Table 2, and the cross section of the film is shown in FIG. 3 on a synthetic quartz substrate 20 (refractive index: 1.51 at 248 nm). The medium is air.

The first layer 21 is composed of dry process $MgF_2$ having a refractive index of 1.40 with respect to the light beam at the wavelength of 248 nm and an optical thickness of 103 nm (0.42-fold of the designed central wavelength $\lambda_0$). The second layer 22 is composed of wet process $MgF_2$ having a refractive index of 1.16 with respect to the light beam at the wavelength of 248 nm and an optical thickness of 19 nm (0.08-fold of the designed central wavelength $\lambda_0$). The third layer 23 is composed of dry process $HfO_2$ having a refractive index of 2.28 with respect to the light beam at the wavelength of 248 nm and an optical thickness of 21 nm (0.08-fold of the designed central wavelength $\lambda_0$). The fourth layer 24 is composed of dry process $Al_2O_3$ having a refractive index of 1.73 with respect to the light beam at the wavelength of 248 nm and an optical thickness of 74 nm (0.30-fold of the designed central wavelength $\lambda_0$). The fifth layer 25 is composed of dry process $HfO_2$ having a refractive index of 2.28 with respect to the light beam at the wavelength of 248 nm and an optical thickness of 16 nm (0.07-fold of the designed central wavelength $\lambda_0$) The sixth layer 26 is composed of wet process $MgF_2$ having a refractive index of 1.16 with respect to the light beam at the wavelength of 248 nm and an optical thickness of 69 nm (0.28-fold of the designed central wavelength $\lambda_0$). The seventh layer 27 is composed of dry process $MgF_2$ having a refractive index of 1.40 with respect to the light beam at the wavelength of 248 nm and an optical thickness of 3 nm (0.01-fold of the designed central wavelength $\lambda_0$). In this case, the designed central wavelength $\lambda_0$ is 248 nm.

The anti-reflection film includes the second layer and the sixth layer which are formed in accordance with the wet process. The $MgF_2$ film based on the wet process was formed in accordance with the hydrofluoric acid/magnesium acetate method in the same manner as in the first embodiment. The thin film based on the dry process was formed by using the EB vapor deposition method in the same manner as in the first embodiment.

TABLE 2

| Layer number | Film substance | Refractive index (248 nm) | Optical thickness/nm |
|---|---|---|---|
| 20 | substrate: quartz glass | | |
| 21 | dry $MgF_2$ | 1.40 | 103.2 |
| 22 | wet $MgF_2$ | 1.16 | 19.2 |
| 23 | dry $HfO_2$ | 2.28 | 20.6 |
| 24 | dry $Al_2O_3$ | 1.73 | 73.9 |
| 25 | dry $HfO_2$ | 2.28 | 16.1 |
| 26 | wet $MgF_2$ | 1.16 | 69.0 |
| 27 | dry $MgF_2$ | 1.40 | 2.5 |

Figure 4:
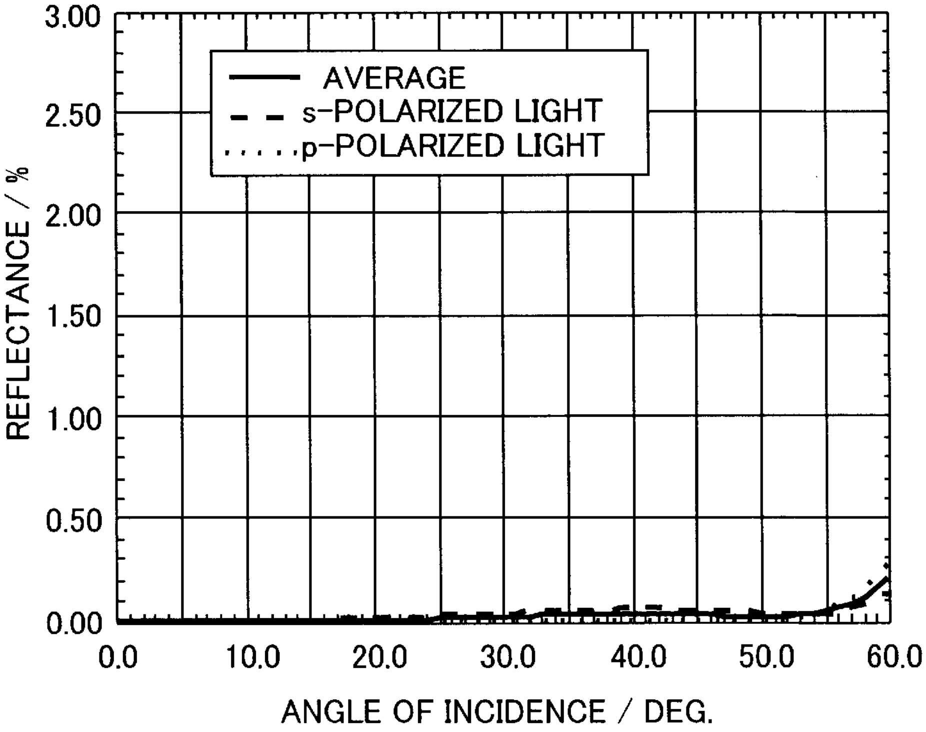
FIG. 4 shows results of measurement of angle-dependent characteristics of the reflectance obtained for the film structure according to the second embodiment.

The reflection characteristics of the anti-reflection film obtained as described above were investigated as follows. The anti-reflection film was irradiated with the s-polarized light and the p-polarized light at the wavelength of 248 nm at a variety of angles of incidence to measure the change of the reflectance with respect to the angle of incidence. Obtained results of the measurement are shown in FIG. 4. As clarified from FIG. 4, although the anti-reflection film of the present invention has the relatively small number of layers, i.e., seven layers, any one of the reflectances for the s-polarized light and the p-polarized light and the average reflectance thereof was not more than 0.1% in a range of the angle of incidence from 0 degree (perpendicular incidence) to 55 degrees. Therefore, the difference in reflectance, which is caused by the difference in polarization, is extremely small. The characteristic, in which the reflection is favorably low and the reflection does not depend on the direction of polarization, is still maintained at an angle of incidence of 60 degrees exceeding 55 degrees.

Comparative Example 1

Figure 5:
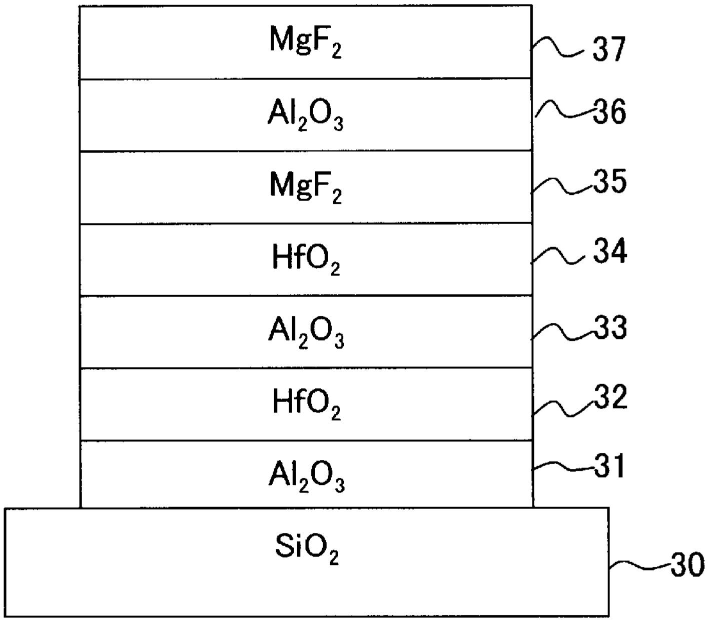
FIG. 5 shows a film structure concerning Comparative Example 1.

As a comparative example, a seven-layered anti-reflection film for the same excimer laser light beam (wavelength: 248 nm) as that used in the first embodiment was produced. The anti-reflection film comprises first to seventh layers on a synthetic quartz substrate 30 having a refractive index of 1.51 at the wavelength of 248 nm. The film arrangement is shown in Table 3, and the cross-sectional structure of the film is shown in FIG. 5. The medium is air.

The first layer 31 is composed of $Al_2O_3$ having a refractive index of 1.73 with respect to the light beam at the wavelength of 248 nm and an optical thickness of 79 nm (0.32-fold of the designed central wavelength $\lambda_0$). The second layer 32 is composed of $HfO_2$ having a refractive index of 2.28 with respect to the light beam at the wavelength of 248 nm and an optical thickness of 78 nm (0.31-fold of the designed central wavelength $\lambda_0$). The third layer 33 is composed of $Al_2O_3$ having a refractive index of 1.73 with respect to the light beam at the wavelength of 248 nm and an optical thickness of 34 nm (0.14-fold of the designed central wavelength $\lambda_0$). The fourth layer 34 is composed of $HfO_2$ having a refractive index of 2.28 with respect to the light beam at the wavelength of 248 nm and an optical thickness of 16 nm (0.06-fold of the designed central wavelength $\lambda_0$). The fifth layer 35 is composed of $MgF_2$ having a refractive index of 1.40 with respect to the light beam at the wavelength of 248 nm and an optical thickness of 82 nm (0.33-fold of the designed central wavelength $\lambda_0$). The sixth layer 36 is composed of $Al_2O_3$ having a refractive index of 1.73 with respect to the light beam at the wavelength of 248 nm and an optical thickness of 73 nm (0.29-fold of the designed central wavelength $\lambda_0$). The seventh layer 37 is composed of $MgF_2$ having a refractive index of 1.40 with respect to the light beam at the wavelength of 248 nm and an optical thickness of 67 nm (0.27-fold of the designed central wavelength $\lambda_0$). The designed central wavelength $\lambda_0$ is 248 nm in the same manner as in the first embodiment.

All of the seven layers for constructing the anti-reflection film were formed by means of the dry process based on the EB vapor deposition method in the same manner as in the first embodiment.

TABLE 3

| Layer number | Film substance | Refractive index (248 nm) | Optical thickness/nm |
|---|---|---|---|
| 30 | substrate: quartz glass | | |
| 31 | dry $Al_2O_3$ | 1.73 | 79.0 |
| 32 | dry $HfO_2$ | 2.28 | 77.7 |
| 33 | dry $Al_2O_3$ | 1.73 | 33.7 |
| 34 | dry $HfO_2$ | 2.28 | 16.0 |
| 35 | dry $MgF_2$ | 1.40 | 81.5 |
| 36 | dry $Al_2O_3$ | 1.73 | 72.8 |
| 37 | dry $MgF_2$ | 1.40 | 67.0 |

Figure 6:
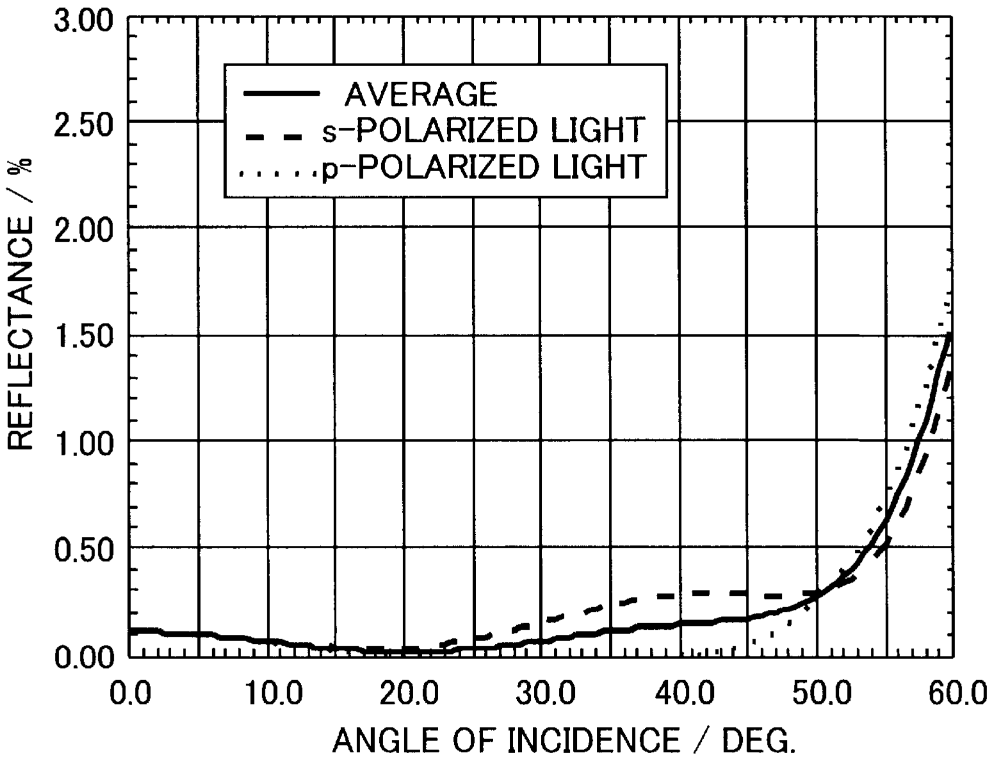
FIG. 6 shows results of measurement of angle-dependent characteristics of the reflectance obtained for the film structure concerning Comparative Example 1.

The reflection characteristics of the anti-reflection film obtained as described above were investigated as follows. The anti-reflection film was irradiated with the s-polarized light and the p-polarized light at the wavelength of 248 nm at a variety of angles of incidence to measure the change of the reflectance with respect to the angle of incidence. Obtained results of the measurement are shown in FIG. 6. As clarified from FIG. 6, in the anti-reflection film of Comparative Example 1, the difference in refractive index is maintained to be not more than 0.3% at the maximum within a range of the angle of incidence from 0 degree (perpendicular incidence) to 50 degrees. However, the difference in refractive index between the s-polarized light and the p-polarized light cannot be ignored from an angle of incidence of 20 degrees to those in the vicinity of 50 degrees. For example, in the vicinity of an angle of incidence of 40 degrees, the reflectance for the s-polarized light is about 0.3%, and the reflectance for the p-polarized light is 0%, in which the difference in refractive index caused by the difference in polarization is large. Further, when the angle of incidence exceeds 50 degrees, the average reflectance is quickly increased. The average reflectance arrives at about 1.6% at an angle of incidence of 60 degrees, as well as the difference in refractive index caused by the difference in polarization cannot be ignored.

The anti-reflection film produced in this example is applied to an optical element such as a lens part for the optical system. When the optical system is, for example, a projection lens for the semiconductor exposure having N.A. of not less than 0.8, the light, which has an angle of incidence up to about 60 degrees, generally comes into the respective lens parts incorporated into the projection lens to such an extent that the light is not negligible. For this reason, the difference in refractive index arises in the projection lens due to the difference in polarization direction, giving rise to such a problem that the optical characteristic is changed thereby. Further, other problems arise such that the amount of transmitted light is decreased due to the reflection loss, and the amount of peripheral light is lowered. These problems are more serious when the number of constitutive lens parts is large. Therefore, when such an optical system is used, it is necessary to previously consider the influence of the reflectance caused by the difference is polarization direction. Even when this fact is taken into consideration, the optical characteristic is not sufficient due to the reflection loss. This problem is not limited to the projection lens, which occurs in all optical systems having a large oblique incidence component of the optical element to be incorporated into the exposure apparatus. Because of the reason as described above, it is difficult to apply the optical element provided with the anti-reflection film to any optical system such as a projection lens which satisfies N.A.≧2 0.8.

Third Embodiment

Figure 7:
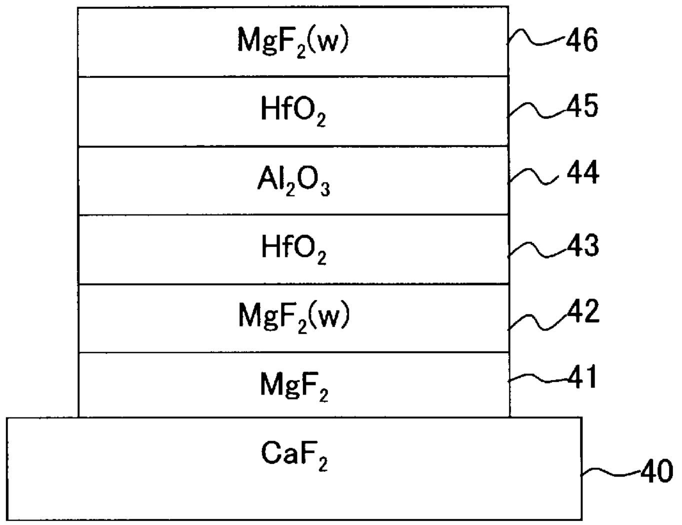
FIG. 7 shows a film structure according to a third embodiment of the present invention.

In the third embodiment, a six-layered anti-reflection film for the KrF excimer laser light beam (wavelength: 248 nm) is produced. The film arrangement is shown in Table 4, and the cross section of the film is shown in FIG. 7 on a fluorite substrate 40 (refractive index: 1.47 at 248 nm). The medium is air. The first layer 41 is composed of dry process $MgF_2$ having a refractive index of 1.40 with respect to the light beam at the wavelength of 248 nm and an optical thickness of 106 nm (0.43-fold of the designed central wavelength $\lambda_0$). The second layer 42 is composed of wet process $MgF_2$ having a refractive index of 1.16 with respect to the light beam at the wavelength of 248 nm and an optical thickness of 20 nm (0.08-fold of the designed central wavelength $\lambda_0$). The third layer 43 is composed of dry process $HfO_2$ having a refractive index of 2.28 with respect to the light beam at the wavelength of 248 nm and an optical thickness of 21 nm (0.08-fold of the designed central wavelength $\lambda_0$). The fourth layer 44 is composed of dry process $Al_2O_3$ having a refractive index of 1.73 with respect to the light beam at the wavelength of 248 nm and an optical thickness of 75 nm (0.30-fold of the designed central wavelength $\lambda_0$). The fifth layer 25 is composed of dry process $HfO_2$ having a refractive index of 2.28 with respect to the light beam at the wavelength of 248 nm and an optical thickness of 17 nm (0.07-fold of the designed central wavelength $\lambda_0$). The sixth layer 26 is composed of wet process $MgF_2$ having a refractive index of 1.16 with respect to the light beam at the wavelength of 248 nm and an optical thickness of 77 nm (0.31-fold of the designed central wavelength $\lambda_0$). In this case, the designed central wavelength $\lambda_0$ is 248 nm.

The anti-reflection film includes the second layer and the sixth layer as the uppermost layer which are formed in accordance with the wet process. The $MgF_2$ film based on the wet process was formed in accordance with the hydrofluoric acid/magnesium acetate method in the same manner as in the first embodiment. The thin film based on the dry process was formed by using the EB vapor deposition method in the same manner as in the first embodiment.

TABLE 4

| Layer number | Film substance | Refractive index (248 nm) | Optical thickness/nm |
|---|---|---|---|
| 40 | | substrate: fluorite | |
| 41 | dry $MgF_2$ | 1.40 | 105.7 |
| 42 | wet $MgF_2$ | 1.16 | 20.0 |
| 43 | dry $HfO_2$ | 2.28 | 20.6 |
| 44 | dry $Al_2O_3$ | 1.73 | 75.1 |
| 45 | dry $HfO_2$ | 2.28 | 17.1 |
| 46 | wet $MgF_2$ | 1.16 | 76.8 |

Figure 8:
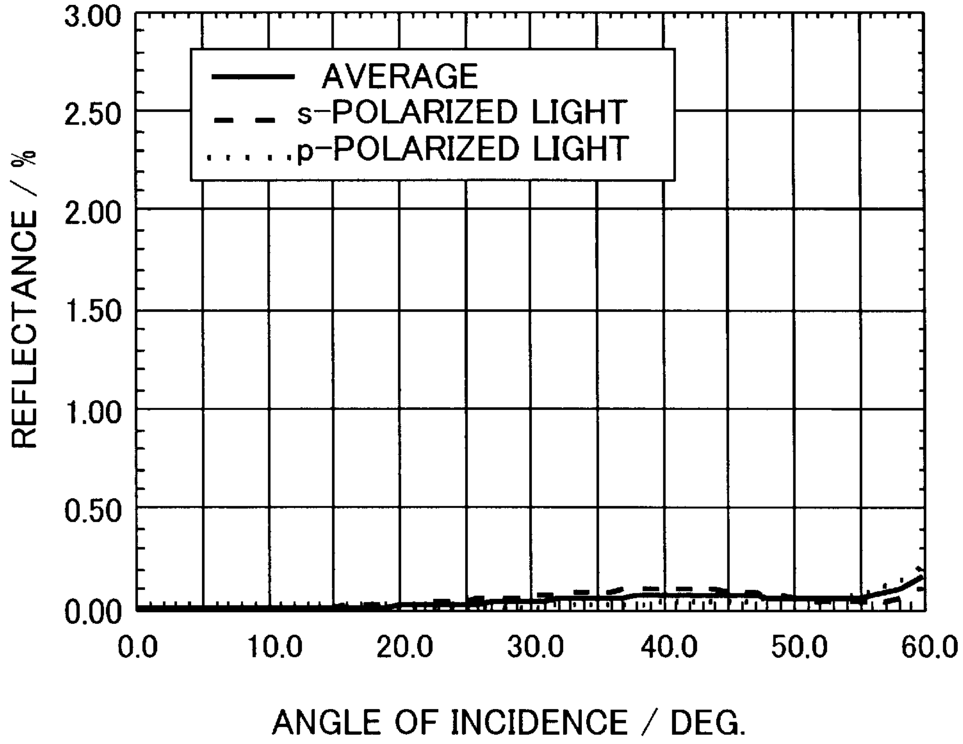
FIG. 8 shows results of measurement of angle-dependent characteristics of the reflectance obtained for the film structure according to the third embodiment.

The reflection characteristics of the anti-reflection film obtained as described above were investigated as follows. The anti-reflection film was irradiated with the s-polarized light and the p-polarized light at the wavelength of 248 nm at a variety of angles of incidence to measure the change of the reflectance with respect to the angle of incidence. Obtained results of the measurement are shown in FIG. 8. As clarified from FIG. 8, although the anti-reflection film of the present invention has the relatively small number of layers, i.e., six layers, any one of the reflectances for the s-polarized light and the p-polarized light and the average reflectance thereof was not more than 0.1% in a range of the angle of incidence from 0 degree (perpendicular incidence) to 56 degrees. Therefore, the difference in reflectance, which is caused by the difference in polarization, is extremely small. The characteristic, in which the reflection is favorably low and the reflection does not depend on the direction of polarization, is still maintained at an angle of incidence of 60 degrees exceeding 56 degrees.

Fourth Embodiment

Figure 9:
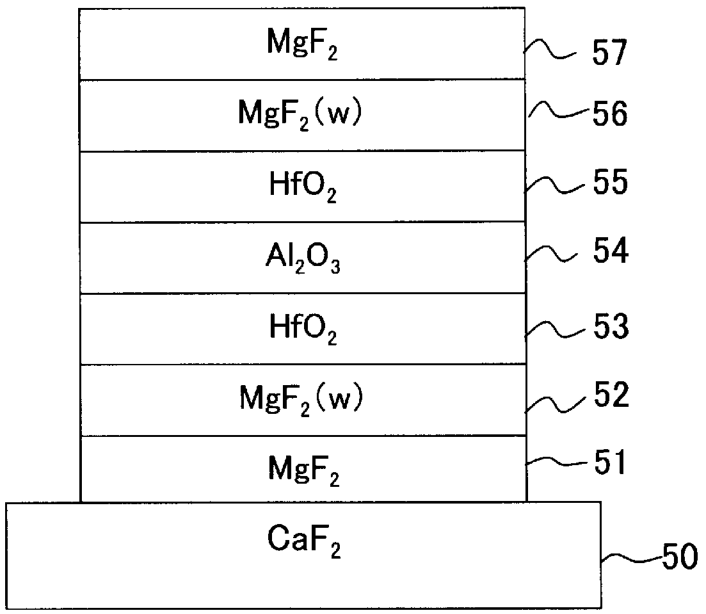
FIG. 9 shows a film structure according to a fourth embodiment of the present invention.

In the fourth embodiment, a seven-layered anti-reflection film for the KrF excimer laser light beam (wavelength: 248 nm) is produced. The film arrangement is shown in Table 5, and the cross section of the film is shown in FIG. 9 on a fluorite substrate 50 (refractive index: 1.47 at 248 nm). The medium is air. The first layer 51 is composed of dry process $MgF_2$ having a refractive index of 1.40 with respect to the light beam at the wavelength of 248 nm and an optical thickness of 103 nm (0.42-fold of the designed central wavelength $\lambda_0$). The second layer 52 is composed of wet process $MgF_2$ having a refractive index of 1.16 with respect to the light beam at the wavelength of 248 nm and an optical thickness of 19 nm (0.08-fold of the designed central wavelength $\lambda_0$). The third layer 53 is composed of dry process $HfO_2$ having a refractive index of 2.28 with respect to the light beam at the wavelength of 248 nm and an optical thickness of 21 nm (0.08-fold of the designed central wavelength $\lambda_0$). The fourth layer 54 is composed of dry process $Al_2O_3$ having a refractive index of 1.73 with respect to the light beam at the wavelength of 248 nm and an optical thickness of 74 nm (0.30-fold of the designed central wavelength $\lambda_0$). The fifth layer 55 is composed of dry process $HfO_2$ having a refractive index of 2.28 with respect to the light beam at the wavelength of 248 nm and an optical thickness of 16 nm (0.07-fold of the designed central wavelength $\lambda_0$). The sixth layer 56 is composed of wet process $MgF_2$ having a refractive index of 1.16 with respect to the light beam at the wavelength of 248 nm and an optical thickness of 69 nm (0.28-fold of the designed central wavelength $\lambda_0$). The seventh layer 57 is composed of dry process $MgF_2$ having a refractive index of 1.40 with respect to the light beam at the wavelength of 248 nm and an optical thickness of 3 nm (0.01-fold of the designed central wavelength $\lambda_0$). In this case, the designed central wavelength $\lambda_0$ is 248 nm. The anti-reflection film includes the second layer and the sixth layer which are formed in accordance with the wet process. The $MgF_2$ film based on the wet process was formed in accordance with the hydrofluoric acid/magnesium acetate method in the same manner as in the first embodiment. The thin film based on the dry process was formed by using the EB vapor deposition method in the same manner as in the first embodiment.

TABLE 5

| Layer number | Film substance | Refractive index (248 nm) | Optical thickness/nm |
|---|---|---|---|
| 50 | | substrate: fluorite | |
| 51 | dry $MgF_2$ | 1.40 | 103.2 |
| 52 | wet $MgF_2$ | 1.16 | 19.2 |
| 53 | dry $HfO_2$ | 2.28 | 20.6 |
| 54 | dry $Al_2O_3$ | 1.73 | 73.9 |
| 55 | dry $HfO_2$ | 2.28 | 16.1 |
| 56 | wet $MgF_2$ | 1.16 | 69.0 |
| 57 | dry $MgF_2$ | 1.40 | 2.5 |

Figure 10:
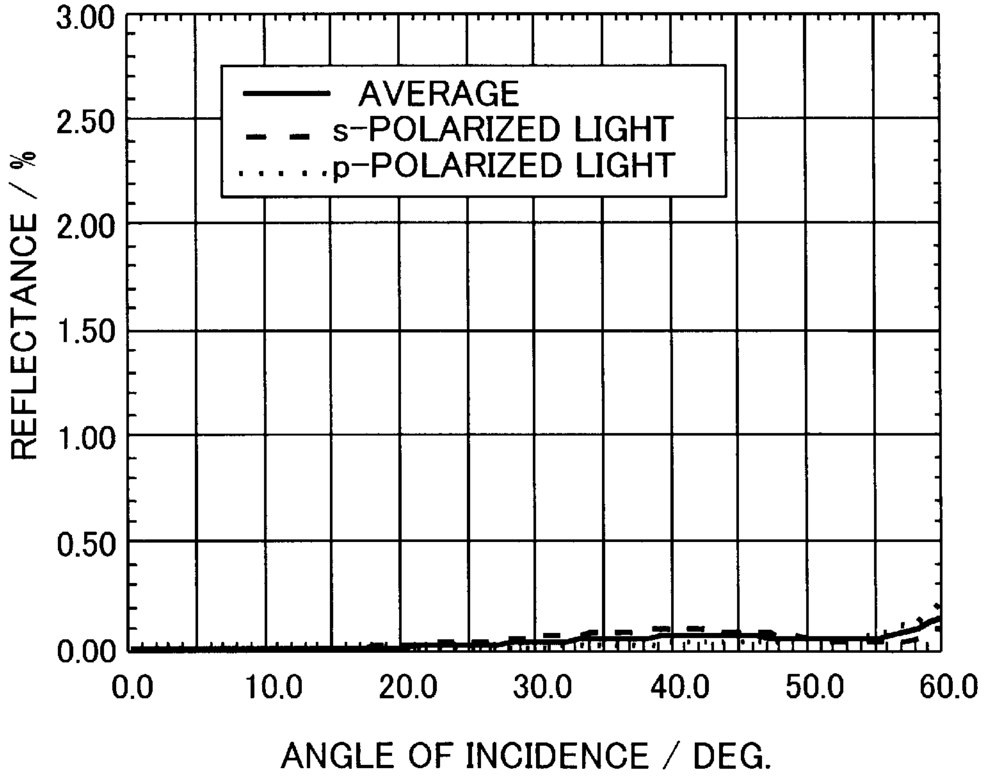
FIG. 10 shows results of measurement of angle-dependent characteristics of the reflectance obtained for the film structure according to the fourth embodiment.

The reflection characteristics of the anti-reflection film obtained as described above were investigated as follows. The anti-reflection film was irradiated with the s-polarized light and the p-polarized light at the wavelength of 248 nm at a variety of angles of incidence to measure the change of the reflectance with respect to the angle of incidence. Obtained results of the measurement are shown in FIG. 10. As clarified from FIG. 10, although the anti-reflection film of the present invention has the relatively small number of layers, i.e., seven layers, any one of the reflectances for the s-polarized light and the p-polarized light and the average reflectance thereof was not more than 0.1% in a range of the angle of incidence from 0 degree (perpendicular incidence) to 56 degrees. Therefore, the difference in reflectance, which is caused by the difference in polarization, is extremely small. The characteristic, in which the reflection is favorably low and the reflection does not depend on the direction of polarization, is still maintained at an angle of incidence of 60 degrees exceeding 56 degrees.

Comparative Example 2

Figure 11:
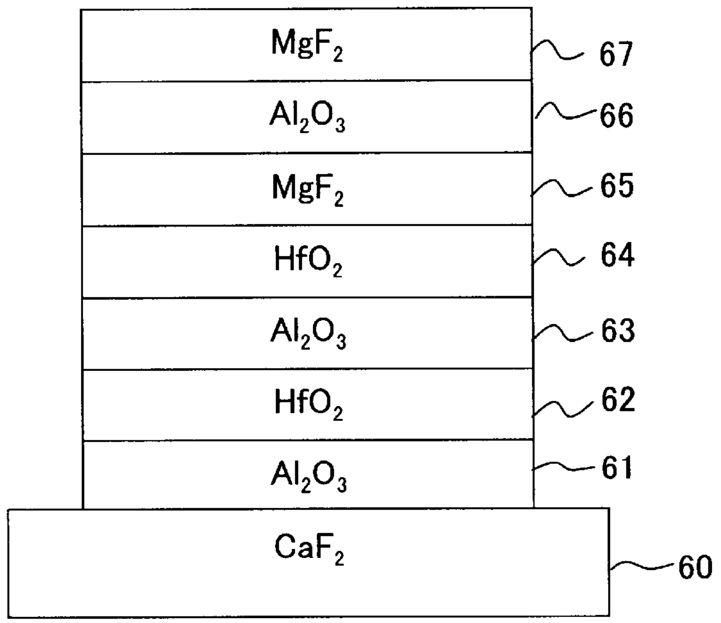
FIG. 11 shows a film structure concerning Comparative Example 2.

In Comparative Example 2, a seven-layered anti-reflection film for the same excimer laser light beam (wavelength: 248 nm) as that used in the first embodiment was produced. The film arrangement is shown in Table 6, and the cross section of the film is shown in FIG. 11 on a fluorite substrate 60 (refractive index: 1.47 at 248 nm). The medium is air. The first layer 61 is composed of $Al_2O_3$ having a refractive index of 1.73 with respect to the light beam at the wavelength of 248 nm and an optical thickness of 78 nm (0.31-fold of the designed central wavelength $\lambda_0$).

The second layer 62 is composed of $HfO_2$ having a refractive index of 2.28 with respect to the light beam at the wavelength of 248 nm and an optical thickness of 82 nm (0.33-fold of the designed central wavelength $\lambda_0$). The third layer 53 is composed of $Al_2O_3$ having a refractive index of 1.73 with respect to the light beam at the wavelength of 248 nm and an optical thickness of 35 nm (0.14-fold of the designed central wavelength $\lambda_0$). The fourth layer 64 is composed of $HfO_2$ having a refractive index of 2.28 with respect to the light beam at the wavelength of 248 nm and an optical thickness of 14 nm (0.06-fold of the designed central wavelength $\lambda_0$). The fifth layer 65 is composed of $MgF_2$ having a refractive index of 1.40 with respect to the light beam at the wavelength of 248 nm and an optical thickness of 84 nm (0.34-fold of the designed central wavelength $\lambda_0$). The sixth layer 66 is composed of $Al_2O_3$ having a refractive index of 1.73 with respect to the light beam at the wavelength of 248 nm and an optical thickness of 74 nm (0.30-fold of the designed central wavelength $\lambda_0$). The seventh layer 67 is composed of $MgF_2$ having a refractive index of 1.40 with respect to the light beam at the wavelength of 248 nm and an optical thickness of 68 nm (0.28-fold of the designed central wavelength $\lambda_0$). In this case, the designed central wavelength $\lambda_0$ is 248 nm in the same manner as in the first embodiment. All of the seven layers of the anti-reflection film were formed by means of the dry process based on the EB vapor deposition method used in the first embodiment.

TABLE 6

| Layer number | Film substance | Refractive index (248 nm) | Optical thickness/nm |
|---|---|---|---|
| 60 | | substrate: fluorite | |
| 61 | dry $Al_2O_3$ | 1.73 | 77.9 |
| 62 | dry $HfO_2$ | 2.28 | 82.1 |
| 63 | dry $Al_2O_3$ | 1.73 | 34.9 |
| 64 | dry $HfO_2$ | 2.28 | 14.3 |
| 65 | dry $MgF_2$ | 1.40 | 83.9 |
| 66 | dry $Al_2O_3$ | 1.73 | 74.4 |
| 67 | dry $MgF_2$ | 1.40 | 68.3 |

Figure 12:
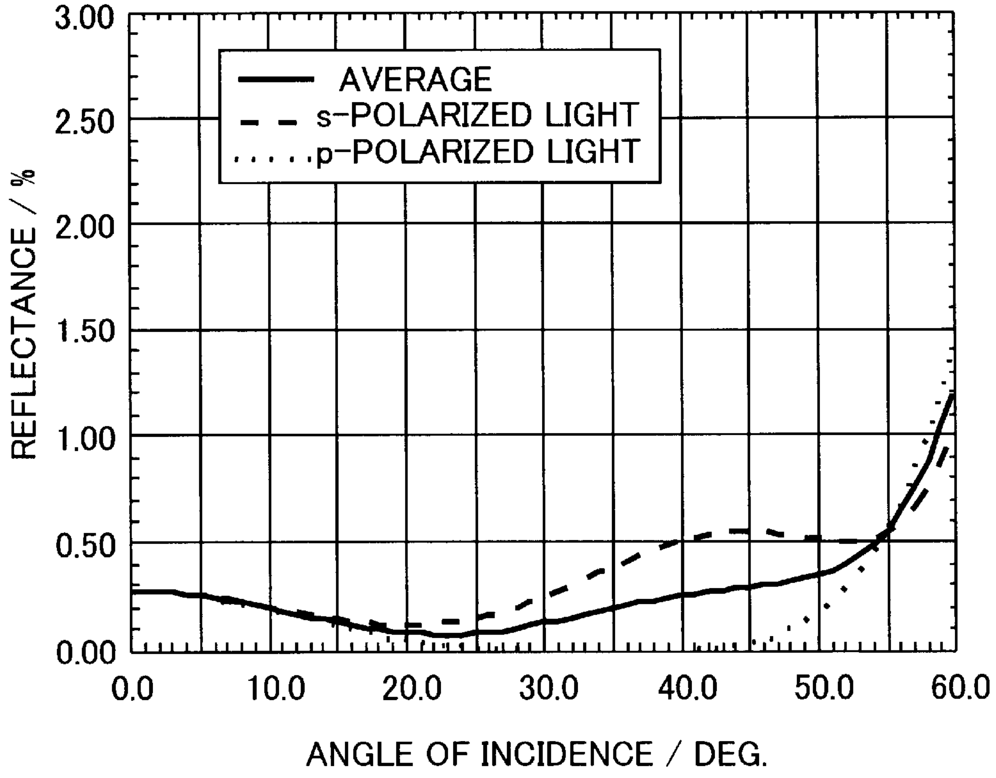
FIG. 12 shows results of measurement of angle-dependent characteristics of the reflectance obtained for the film structure concerning Comparative Example 2.

The reflection characteristics of the anti-reflection film obtained as described above were investigated as follows. The anti-reflection film was irradiated with the s-polarized light and the p-polarized light at the wavelength of 248 nm at a variety of angles of incidence to measure the change of the reflectance with respect to the angle of incidence. Obtained results of the measurement are shown in FIG. 12. As clarified from FIG. 12, in the anti-reflection film of Comparative Example 2, the difference in refractive index is maintained to be not more than 0.6% at the maximum within a range of the angle of incidence from 0 degree (perpendicular incidence) to 50 degrees. However, the difference in refractive index between the s-polarized light and the p-polarized light cannot be ignored from an angle of incidence of 20 degrees to those in the vicinity of 50 degrees. For example, in the vicinity of an angle of incidence of 40 degrees, the reflectance for the s-polarized light is about 0.6%, and the reflectance for the p-polarized light is 0.05%, in which the difference in refractive index caused by the difference in polarization is large. Further, when the angle of incidence exceeds 50 degrees, the average reflectance is quickly increased. The average reflectance arrives at about 1.2% at an angle of incidence of 60 degrees, as well as the difference in refractive index caused by the difference in polarization cannot be ignored. The anti-reflection film produced in conventional Comparative Example 2 is applied to an optical element such as a lens part for the optical system. When the optical system is, for example, a projection lens for the semiconductor exposure having N.A. of not less than 0.8, the light, which has an angle of incidence up to about 60 degrees, generally comes into the respective lens parts incorporated into the projection lens to such an extent that the light is not negligible. For this reason, the difference in refractive index arises in the projection lens due to the difference in polarization direction, giving rise to such a problem that the optical characteristic is changed thereby. Further, other problems arise such that the amount of transmitted light is decreased due to the reflection loss, and the amount of peripheral light is lowered. Due to these problems, it is difficult to apply the optical element provided with the anti-reflection film to any optical system such as a projection lens which satisfies N.A.$\geqq$0.8, because of the reason as explained in Comparative Example 1.

Fifth Embodiment

Figure 13:
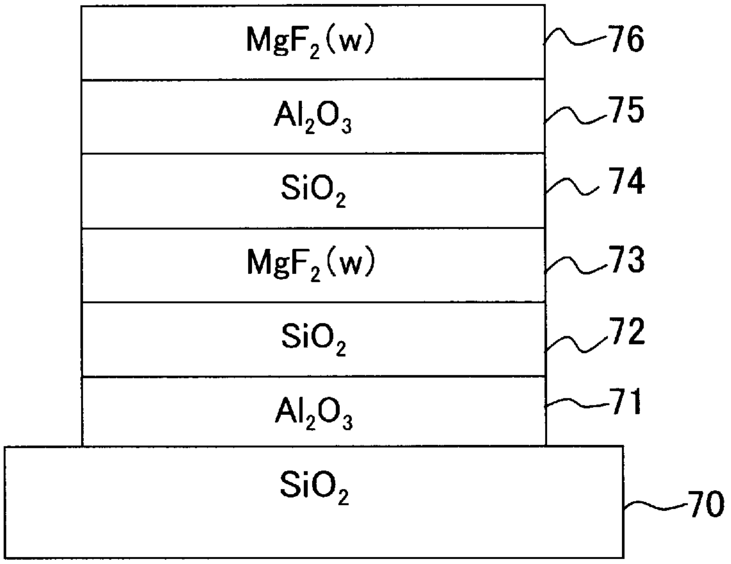
FIG. 13 shows a film structure according to a fifth embodiment of the present invention.

In the fifth embodiment, a six-layered anti-reflection film for the ArF excimer laser light beam (wavelength: 193 nm) was produced. The film arrangement is shown in Table 7, and the cross section of the film is shown in FIG. 13 on a synthetic quartz substrate 70 (refractive index: 1.56 at 193 nm). The medium is air. The first layer 71 is composed of dry process $Al_2O_3$ having a refractive index of 1.84 with respect to the light beam at the wavelength of 193 nm and an optical thickness of 75 nm (0.39-fold of the designed central wavelength $\lambda_0$). The second layer 72 is composed of dry process $SiO_2$ having a refractive index of 1.54 with respect to the light beam at the wavelength of 193 nm and an optical thickness of 45 nm (0.23-fold of the designed central wavelength $\lambda_0$) The third layer 73 is composed of wet process $MgF_2$ having a refractive index of 1.17 with respect to the light beam at the wavelength of 193 nm and an optical thickness of 30 nm (0.16-fold of the designed central wavelength $\lambda_0$). The fourth layer 74 is composed of dry process $SiO_2$ having a refractive index of 1.54 with respect to the light beam at the wavelength of 193 nm and an optical thickness of 84 nm (0.44-fold of the designed central wavelength $\lambda_0$). The fifth layer 75 is composed of dry process $Al_2O_3$ having a refractive index of 1.84 with respect to the light beam at the wavelength of 193 nm and an optical thickness of 13 nm (0.07-fold of the designed central wavelength $\lambda_0$). The sixth layer 76 is composed of wet process $MgF_2$ having a refractive index of 1.17 with respect to the light beam at the wavelength of 193 nm and an optical thickness of 53 nm (0.27-fold of the designed central wavelength $\lambda_0$). In this case, the designed central wavelength $\lambda_0$ is selected to be 193 nm. The anti-reflection film includes the third layer and the sixth layer as the uppermost layer which are formed in accordance with the wet process. The $MgF_2$ film based on the wet process was formed in accordance with the hydrofluoric acid/magnesium acetate method in the same manner as in the first embodiment. The thin film based on the dry process was formed by using the EB vapor deposition method in the same manner as in the first embodiment.

TABLE 7

| Layer number | Film substance | Refractive index (193 nm) | Optical thickness/nm |
|---|---|---|---|
| 70 | | substrate: quartz glass | |
| 71 | dry $Al_2O_3$ | 1.84 | 75.3 |

TABLE 7-continued

| Layer number | Film substance | Refractive index (193 nm) | Optical thickness/nm |
|---|---|---|---|
| 72 | dry $SiO_2$ | 1.54 | 45.0 |
| 73 | wet $MgF_2$ | 1.17 | 30.3 |
| 74 | dry $SiO_2$ | 1.54 | 83.9 |
| 75 | dry $Al_2O_3$ | 1.84 | 13.0 |
| 76 | wet $MgF_2$ | 1.17 | 52.8 |

Figure 14:
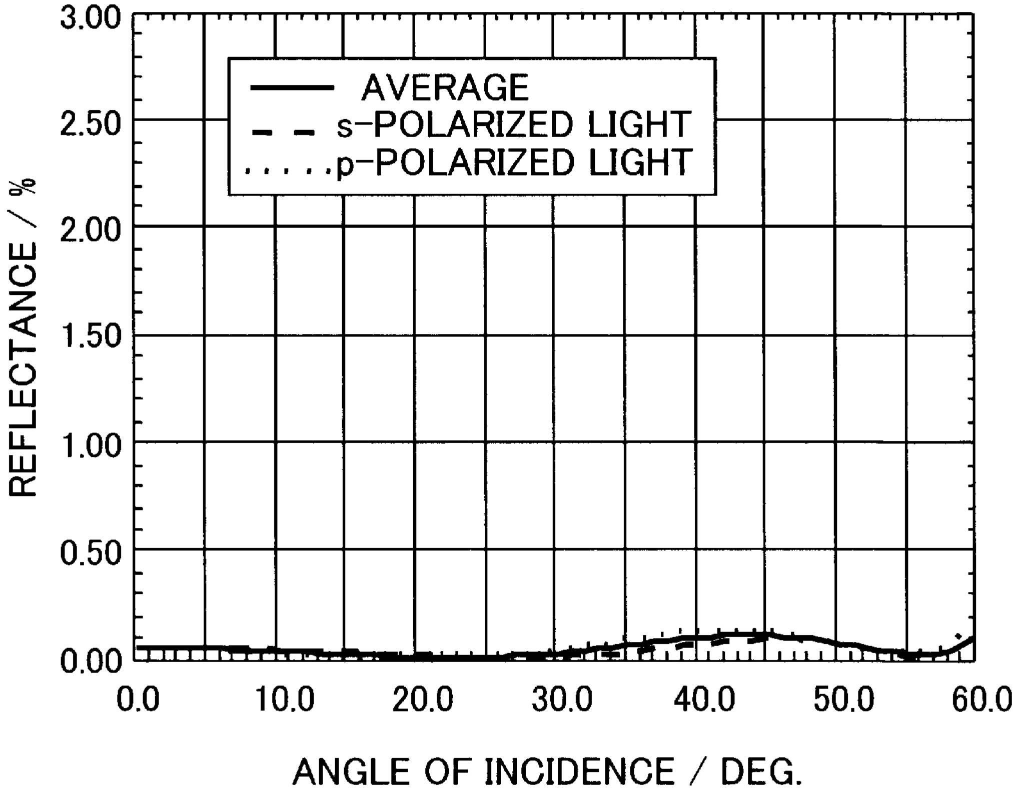
FIG. 14 shows results of measurement of angle-dependent characteristics of the reflectance obtained for the film structure according to the fifth embodiment.

The reflection characteristics of the anti-reflection film obtained as described above were investigated as follows. The anti-reflection film was irradiated with the s-polarized light and the p-polarized light at the wavelength of 193 nm at a variety of angles of incidence to measure the change of the reflectance with respect to the angle of incidence. Obtained results of the measurement are shown in FIG. 14. As clarified from FIG. 14, although the anti-reflection film of the present invention has the relatively small number of layers, i.e., six layers, any one of the reflectances for the s-polarized light and the p-polarized light and the average reflectance thereof was not more than 0.2% in a range of the angle of incidence from 0 degree (perpendicular incidence) to 54 degrees. Therefore, the difference in reflectance, which is caused by the difference in polarization, is extremely small. The characteristic, in which the reflection is favorably low and the reflection does not depend on the direction of polarization, is still maintained at an angle of incidence of 60 degrees exceeding 54 degrees.

Sixth Embodiment

Figure 15:
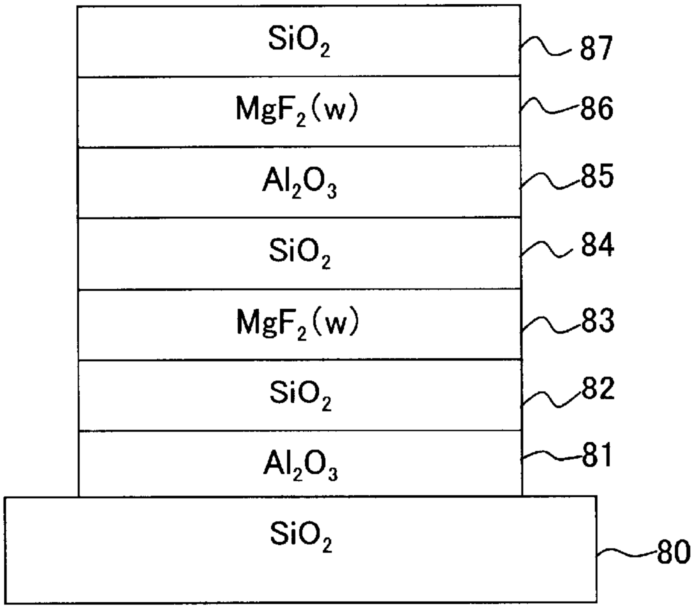
FIG. 15 shows a film structure according to a sixth embodiment of the present invention.

In the sixth embodiment, a seven-layered anti-reflection film for the ArF excimer laser light beam (wavelength: 193 nm) was produced. The film arrangement is shown in Table 8, and the cross section of the film is shown in FIG. 15 on a synthetic quartz substrate 80 (refractive index: 1.56 at 193 nm). The medium is air. The first layer 81 is composed of dry process $Al_2O_3$ having a refractive index of 1.84 with respect to the light beam at the wavelength of 193 nm and an optical thickness of 75 nm (0.39-fold of the designed central wavelength $\lambda_0$). The second layer 82 is composed of dry process $SiO_2$ having a refractive index of 1.54 with respect to the light beam at the wavelength of 193 nm and an optical thickness of 44 nm (0.23-fold of the designed central wavelength $\lambda_0$). The third layer 83 is composed of wet process $MgF_2$ having a refractive index of 1.17 with respect to the light beam at the wavelength of 193 nm and an optical thickness of 33 nm (0.17-fold of the designed central wavelength $\lambda_0$). The fourth layer 84 is composed of dry process $SiO_2$ having a refractive index of 1.54 with respect to the light beam at the wavelength of 193 nm and an optical thickness of 80 nm (0.41-fold of the designed central wavelength $\lambda_0$). The fifth layer 85 is composed of dry process $Al_2O_3$ having a refractive index of 1.84 with respect to the light beam at the wavelength of 193 nm and an optical thickness of 16 nm (0.08-fold of the designed central wavelength $\lambda_0$). The sixth layer 86 is composed of wet process $MgF_2$ having a refractive index of 1.17 with respect to the light beam at the wavelength of 193 nm and an optical thickness of 46 nm (0.24-fold of the designed central wavelength $\lambda_0$). The seventh layer 87 is composed of dry process $SiO_2$ having a refractive index of 1.54 with respect to the light beam at the wavelength of 193 nm and an optical thickness of 3 nm (0.02-fold of the designed central wavelength $\lambda_0$). The designed central wavelength $\lambda_0$ was selected to be 193 nm.

The anti-reflection film includes the third layer and the sixth layer which are formed in accordance with the wet process. The $MgF_2$ film based on the wet process was formed in accordance with the hydrofluoric acid/magnesium acetate method in the same manner as in the first embodiment. The film based on the dry process was formed by using the EB vapor deposition method in the same manner as in the first embodiment.

TABLE 8

| Layer number | Film substance | Refractive index (193 nm) | Optical thickness/nm |
|---|---|---|---|
| 80 | substrate: quartz glass | | |
| 81 | dry $Al_2O_3$ | 1.84 | 75.4 |
| 82 | dry $SiO_2$ | 1.54 | 44.2 |
| 83 | wet $MgF_2$ | 1.17 | 32.8 |
| 84 | dry $SiO_2$ | 1.54 | 80.2 |
| 85 | dry $Al_2O_3$ | 1.84 | 16.4 |
| 86 | wet $MgF_2$ | 1.17 | 45.5 |
| 87 | dry $SiO_2$ | 1.54 | 3.1 |

Figure 16:
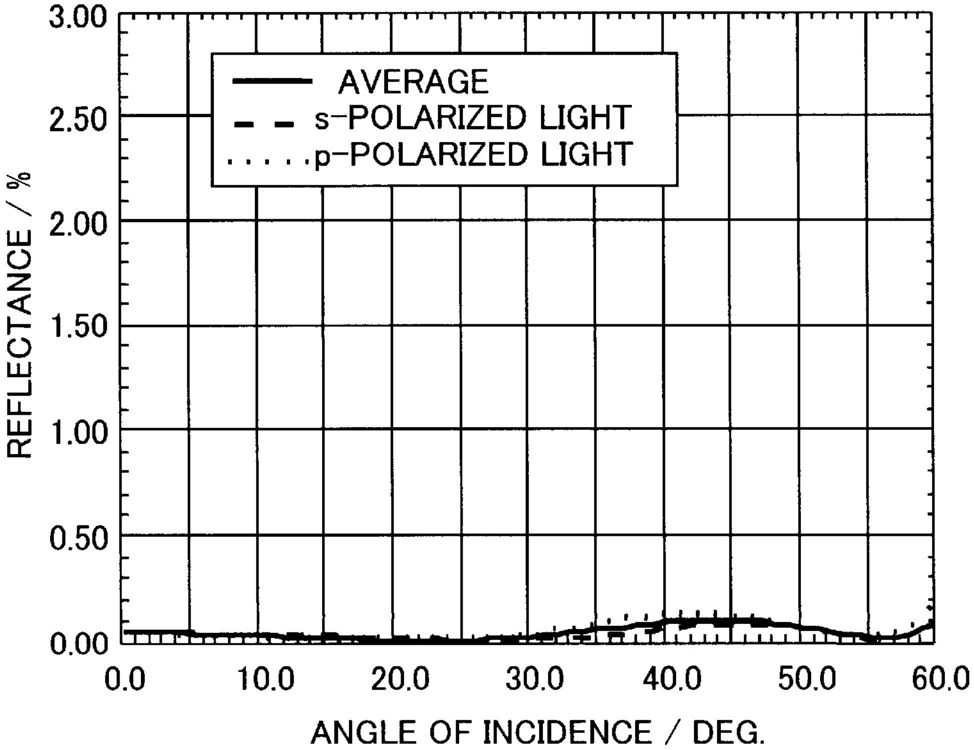
FIG. 16 shows results of measurement of angle-dependent characteristics of the reflectance obtained for the film structure according to the sixth embodiment.

The reflection characteristics of the anti-reflection film obtained as described above were investigated as follows. The anti-reflection film was irradiated with the s-polarized light and the p-polarized light at the wavelength of 193 nm at a variety of angles of incidence to measure the change of the reflectance with respect to the angle of incidence. Obtained results of the measurement are shown in FIG. 16. As clarified from FIG. 16, although the anti-reflection film of the present invention has the relatively small number of layers, i.e., seven layers, any one of the reflectances for the s-polarized light and the p-polarized light and the average reflectance thereof was not more than 0.2% in a range of the angle of incidence from 0 degree (perpendicular incidence) to 54 degrees. Therefore, the difference in reflectance, which is caused by the difference in polarization direction, is extremely small. The characteristic, in which the reflection is favorably low and the reflection does not depend on the direction of polarization, is still maintained at an angle of incidence of 60 degrees exceeding 54 degrees.

Comparative Example 3

Figure 17:
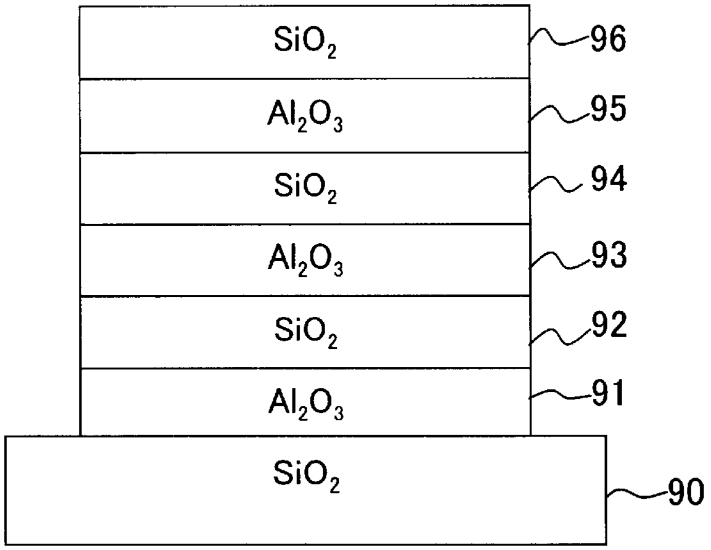
FIG. 17 shows a film structure concerning Comparative Example 3.

In Comparative Example 3, a six-layered anti-reflection film for the same excimer laser light beam (wavelength: 193 nm) was provided. The film arrangement is shown in Table 9, and the cross section of the film is shown in FIG. 17 on a synthetic quartz substrate 90 (refractive index: 1.56 at 193 nm). The medium is air. The first layer 91 is composed of $Al_2O_3$ having a refractive index of 1.84 with respect to the light beam at the wavelength of 193 nm and an optical thickness of 79 nm (0.41-fold of the designed central wavelength $\lambda_0$). The second layer 92 is composed of $SiO_2$ having a refractive index of 1.54 with respect to the light beam at the wavelength of 193 nm and an optical thickness of 76 nm (0.39-fold of the designed central wavelength $\lambda_0$). The third layer 93 is composed of $Al_2O_3$ having a refractive index of 1.84 with respect to the light beam at the wavelength of 193 nm and an optical thickness of 76 nm (0.39-fold of the designed central wavelength $\lambda_0$). The fourth layer 94 is composed of $SiO_2$ having a refractive index of 1.54 with respect to the light beam at the wavelength of 193 nm and an optical thickness of 52 nm (0.27-fold of the designed central wavelength $\lambda_0$). The fifth layer 95 is composed of $Al_2O_3$ having a refractive index of 1.84 with respect to the light beam at the wavelength of 193 nm and an optical thickness of 54 nm (0.28-fold of the designed central wavelength $\lambda_0$). The sixth layer 96 is composed of $SiO_2$ having a refractive index of 1.54 with respect to the light beam at the wavelength of 193 nm and an optical thickness of 49 nm (0.25-fold of the designed central wavelength $\lambda_0$).The designed central wavelength $\lambda_0$ is selected to be 193 nm. All of the six layers of the anti-reflection film were formed by means of the dry process based on the EB vapor deposition method used in the first embodiment.

TABLE 7

| Layer number | Film substance | Refractive index (193 nm) | Optical thickness/nm |
|---|---|---|---|
| 90 | | substrate: quartz glass | |
| 91 | dry $Al_2O_3$ | 1.84 | 79.3 |
| 92 | dry $SiO_2$ | 1.54 | 76.1 |
| 93 | dry $Al_2O_3$ | 1.84 | 76.3 |
| 94 | dry $SiO_2$ | 1.54 | 51.6 |
| 95 | dry $Al_2O_3$ | 1.84 | 54.4 |
| 96 | dry $SiO_2$ | 1.54 | 48.6 |

Figure 18:
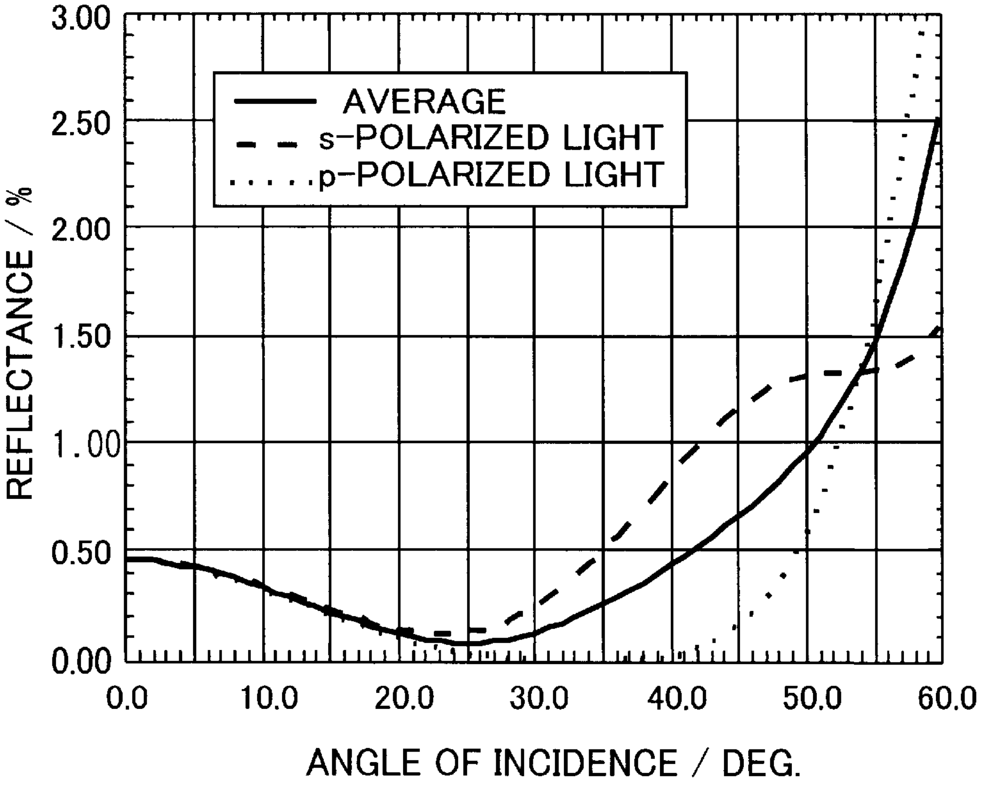
FIG. 18 shows results of measurement of angle-dependent characteristics of the reflectance obtained for the film structure concerning Comparative Example 3.

The reflection characteristics of the anti-reflection film obtained as described above were investigated as follows. The anti-reflection film was irradiated with the s-polarized light and the p-polarized light at the wavelength of 193 nm at a variety of angles of incidence to measure the change of the reflectance with respect to the angle of incidence. Obtained results of the measurement are shown in FIG. 18. As clarified from FIG. 18, in the anti-reflection film of Comparative Example 3, the reflection is maintained to be not more than 0.5% within a range of the angle of incidence from 0 degree (perpendicular incidence) to 35 degrees. However, the reflection for the s-polarized light is extremely large at an angle of incidence of not less than 35 degrees. The reflection for the p-polarized light is extremely large at an angle of incidence of not less than 50 degrees, it exceeds the reflection for the s-polarized light at an angle of incidence of not less than 55 degrees, and it arrives at 3% at an angle of incidence of 58 degrees. The anti-reflection film produced in this example is applied to an optical element such as a lens part for the optical system. When the optical system is, for example, a projection lens for the semiconductor exposure having N.A. of not less than 0.8, the light, which has an angle of incidence up to about 60 degrees, generally comes into the respective lens parts incorporated into the projection lens to such an extent that the light is not negligible. Based on the reason explained in Comparative Example 1, it is difficult to apply the optical element provided with the anti-reflection film to any optical system such as a projection lens which satisfies N.A.$\geqq$0.8.

Seventh Embodiment

Figure 19:
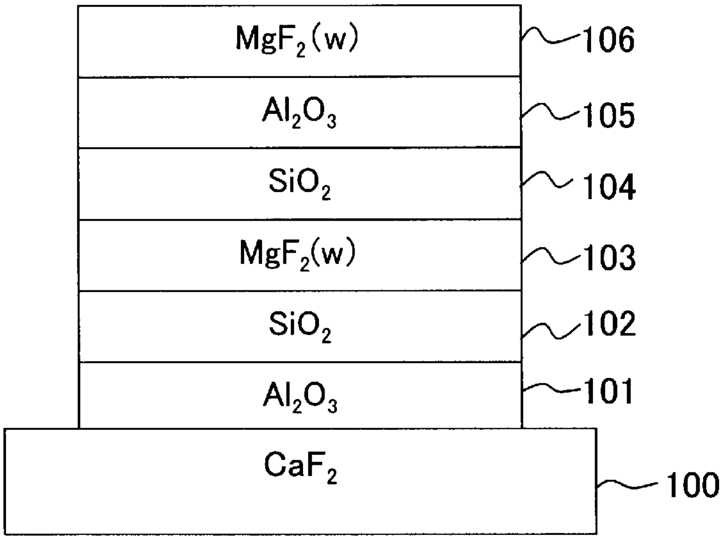
FIG. 19 shows a film structure according to a seventh embodiment of the present invention.

In the seventh embodiment, a six-layered anti-reflection film for the ArF excimer laser light beam (wavelength: 193 nm) was produced. The film arrangement is shown in Table 10, and the cross section of the film is shown in FIG. 19 on a fluorite substrate 100 (refractive index: 1.50 at 193 nm). The medium is air. The first layer 101 is composed of dry process $Al_2O_3$ having a refractive index of 1.84 with respect to the light beam at the wavelength of 193 nm and an optical thickness of 78 nm (0.41-fold of the designed central wavelength $\lambda_0$). The second layer 102 is composed of dry process $SiO_2$ having a refractive index of 1.54 with respect to the light beam at the wavelength of 193 nm and an optical thickness of 41 nm (0.21-fold of the designed central wavelength $\lambda_0$). The third layer 103 is composed of wet process $MgF_2$ having a refractive index of 1.17 with respect to the light beam at the wavelength of 193 nm and an optical thickness of 32 nm (0.17-fold of the designed central wavelength $\lambda_0$). The fourth layer 104 is composed of dry process $SiO_2$ having a refractive index of 1.54 with respect to the light beam at the wavelength of 193 nm and an optical thickness of 82 nm (0.43-fold of the designed central wavelength $\lambda_0$). The fifth layer 105 is composed of dry process $Al_2O_3$ having a refractive index of 1.84 with respect to the light beam at the wavelength of 193 nm and an optical thickness of 14 nm (0.07-fold of the designed central wavelength $\lambda_0$). The sixth layer 106 is composed of wet process $MgF_2$ having a refractive index of 1.17 with respect to the light beam at the wavelength of 193 nm and an optical thickness of 53 nm (0.27-fold of the designed central wavelength $\lambda_0$). The designed central wavelength $\lambda_0$ was selected to be 193 nm.

The anti-reflection film includes the third layer and the sixth layer as the uppermost layer which are formed in accordance with the wet process. The $MgF_2$ film based on the wet process was formed in accordance with the hydrofluoric acid/magnesium acetate method in the same manner as in the first embodiment. The thin film based on the dry process was formed by using the EB vapor deposition method in the same manner as in the first embodiment.

TABLE 10

| Layer number | Film substance | Refractive index (193 nm) | Optical thickness/nm |
|---|---|---|---|
| 100 | | substrate: fluorite | |
| 101 | dry $Al_2O_3$ | 1.84 | 78.2 |
| 102 | dry $SiO_2$ | 1.54 | 41.1 |
| 103 | wet $MgF_2$ | 1.17 | 32.0 |
| 104 | dry $SiO_2$ | 1.54 | 82.1 |
| 105 | dry $Al_2O_3$ | 1.84 | 14.2 |
| 106 | wet $MgF_2$ | 1.17 | 52.5 |

Figure 20:
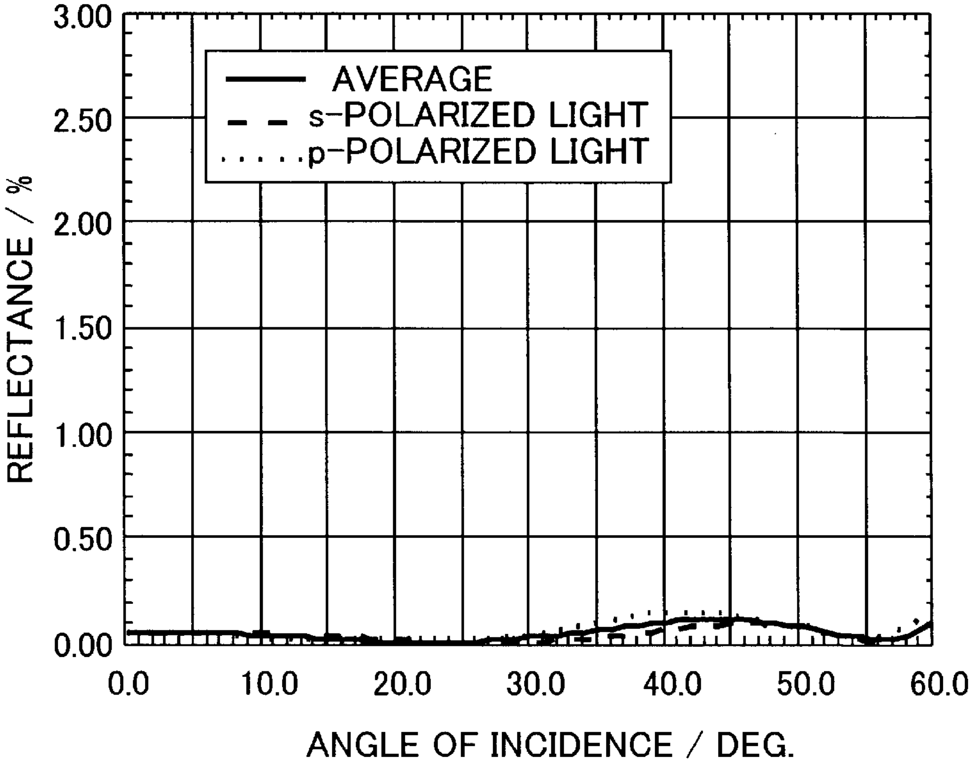
FIG. 20 shows results of measurement of angle-dependent characteristics of the reflectance obtained for the film structure according to the seventh embodiment.

The reflection characteristics of the anti-reflection film obtained as described above were investigated as follows. The anti-reflection film was irradiated with the s-polarized light and the p-polarized light at the wavelength of 1933 nm at a variety of angles of incidence to measure the change of the reflectance with respect to the angle of incidence. Obtained results of the measurement are shown in FIG. 20. As clarified from FIG. 20, although the anti-reflection film of the present invention has the relatively small number of layers, i.e., six layers, any one of the reflectances for the s-polarized light and the p-polarized light and the average reflectance thereof was not more than 0.2% in a range of the angle of incidence from 0 degree (perpendicular incidence) to 53 degrees. Therefore, the difference in reflectance, which is caused by the difference in polarization, is extremely small. The characteristic, in which the reflection is favorably low and the reflection does not depend on the direction of polarization, is still maintained at an angle of incidence of 60 degrees exceeding 54 degrees.

Eighth Embodiment

Figure 21:
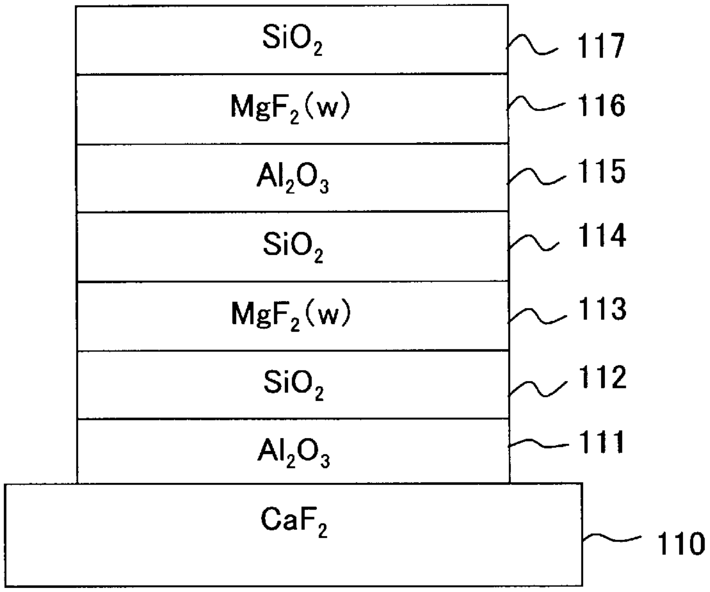
FIG. 21 shows a film structure according to an eighth embodiment of the present invention.

In the eighth embodiment, a seven-layered anti-reflection film for the ArF excimer laser light beam (wavelength: 193 nm) was produced. The film arrangement is shown in Table 11, and the cross section of the film is shown in FIG. 21 on a fluorite substrate 110 (refractive index: 1.50 at 193 nm). The medium is air. The first layer 111 is composed of dry process $Al_2O_3$ having a refractive index of 1.84 with respect to the light beam at the wavelength of 193 nm and an optical thickness of 78 nm (0.41-fold of the designed central wavelength $\lambda_0$). The second layer 112 is composed of dry process $SiO_2$ having a refractive index of 1.54 with respect to the light beam at the wavelength of 193 nm and an optical thickness of 40 nm (0.21-fold of the designed central wavelength $\lambda_0$). The third layer 113 is composed of wet process $MgF_2$ having a refractive index of 1.17 with respect to the light beam at the wavelength of 193 nm and an optical thickness of 35 nm (0.18-fold of the designed central wavelength $\lambda_0$). The fourth layer 114 is composed of dry process $SiO_2$ having a refractive index of 1.54 with respect to the light beam at the wavelength of 193 nm and an optical thickness of 78 nm (0.41-fold of the designed central wavelength $\lambda_0$). The fifth layer 115 is composed of dry process $Al_2O_3$ having a refractive index of 1.84 with respect to the light beam at the wavelength of 193 nm and an optical thickness of 18 nm (0.09-fold of the designed central wavelength $\lambda_0$). The sixth layer 116 is composed of wet process $MgF_2$ having a refractive index of 1.17 with respect to the light beam at the wavelength of 193 nm and an optical thickness of 45 nm (0.23-fold of the designed central wavelength $\lambda_0$). The seventh layer 117 is composed of dry process $SiO_2$ having a refractive index of 1.54 with respect to the light beam at the wavelength of 193 nm and an optical thickness of 3 nm (0.02-fold of the designed central wavelength $\lambda_0$). In this case, the designed central wavelength $\lambda_0$ was selected to be 193 nm.

The anti-reflection film includes the third layer and the sixth layer which are formed in accordance with the wet process. The $MgF_2$ film based on the wet process was formed in accordance with the hydrofluoric acid/magnesium acetate method in the same manner as in the first embodiment. The thin film based on the dry process was formed by using the EB vapor deposition method in the same manner as in the first embodiment.

TABLE 11

| Layer number | Film substance | Refractive index (193 nm) | Optical thickness/nm |
|---|---|---|---|
| 110 | | substrate: fluorite | |
| 111 | dry $Al_2O_3$ | 1.84 | 78.4 |
| 112 | dry $SiO_2$ | 1.54 | 40.1 |
| 113 | wet $MgF_2$ | 1.17 | 34.6 |
| 114 | dry $SiO_2$ | 1.54 | 78.4 |
| 115 | dry $Al_2O_3$ | 1.84 | 17.6 |
| 116 | wet $MgF_2$ | 1.17 | 45.0 |
| 117 | dry $SiO_2$ | 1.54 | 3.2 |

Figure 22:
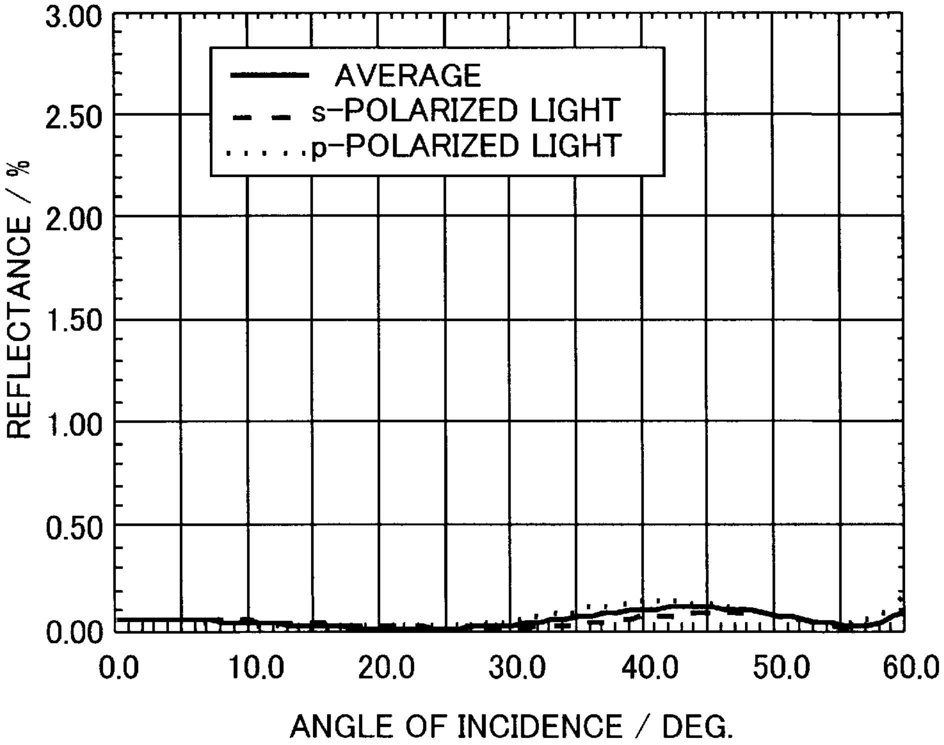
FIG. 22 shows results of measurement of angle-dependent characteristics of the reflectance obtained for the film structure according to the eighth embodiment.

The reflection characteristics of the anti-reflection film obtained as described above were investigated as follows. The anti-reflection film was irradiated with the s-polarized light and the p-polarized light at the wavelength of 193 nm at a variety of angles of incidence to measure the change of the reflectance with respect to the angle of incidence. Obtained results of the measurement are shown in FIG. 22. As clarified from FIG. 22, although the anti-reflection film of the present invention has the relatively small number of layers, i.e., seven layers, any one of the reflectances for the s-polarized light and the p-polarized light and the average reflectance thereof was not more than 0.2% in a range of the angle of incidence from 0 degree (perpendicular incidence) to 52 degrees. Therefore, the difference in reflectance, which is caused by the difference in polarization, is extremely small. The characteristic, in which the reflection is favorably low and the reflection does not depend on the polarization, is still maintained at an angle of incidence of 60 degrees exceeding 52 degrees.

Comparative Example 4

Figure 23:
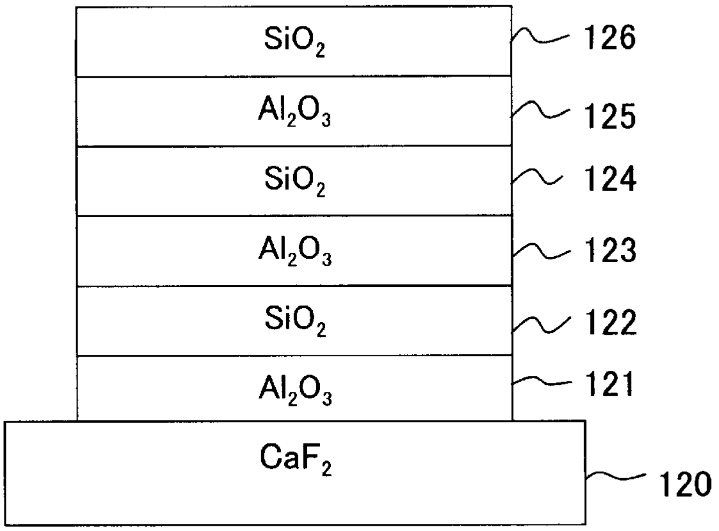
FIG. 23 shows a film structure concerning Comparative Example 4.

In Comparative Example 4, a six-layered anti-reflection film for the excimer laser light beam (wavelength: 193 nm) was produced. The film arrangement is shown in Table 12, and the cross section of the film is shown in FIG. 23 on a fluorite substrate 120 (refractive index: 1.50 at 193 nm). The medium is air. The first layer 121 is composed of $Al_2O_3$ having a refractive index of 1.84 with respect to the light beam at the wavelength of 193 nm and an optical thickness of 82 nm (0.43-fold of the designed central wavelength $\lambda_0$). The second layer 122 is composed of $SiO_2$ having a refractive index of 1.54 with respect to the light beam at the wavelength of 193 nm and an optical thickness of 72 nm (0.38-fold of the designed central wavelength $\lambda_0$). The third layer 123 is composed of $Al_2O_3$ having a refractive index of 1.84 with respect to the light beam at the wavelength of 193 nm and an optical thickness of 77 nm (0.40-fold of the designed central wavelength $\lambda_0$). The fourth layer 124 is composed of $SiO_2$ having a refractive index of 1.54 with respect to the light beam at the wavelength of 193 nm and an optical thickness of 51 nm (0.26-fold of the designed central wavelength $\lambda_0$). The fifth layer 125 is composed of $Al_2O_3$ having a refractive index of 1.84 with respect to the light beam at the wavelength of 193 nm and an optical thickness of 55 nm (0.28-fold of the designed central wavelength $\lambda_0$). The sixth layer 126 is composed of $SiO_2$ having a refractive index of 1.54 with respect to the light beam at the wavelength of 193 nm and an optical thickness of 48 nm (0.25-fold of the designed central wavelength $\lambda_0$). In this case, the designed central wavelength $\lambda_0$ was selected to be 193 nm. All of the six layers of the anti-reflection film were formed by means of the dry process based on the EB vapor deposition method used in the first embodiment.

TABLE 12

| Layer number | Film substance | Refractive index (193 nm) | Optical thickness/nm |
|---|---|---|---|
| 120 | | substrate: fluorite | |
| 121 | dry $Al_2O_3$ | 1.84 | 82.1 |
| 122 | dry $SiO_2$ | 1.54 | 72.4 |
| 123 | dry $Al_2O_3$ | 1.84 | 76.7 |
| 124 | dry $SiO_2$ | 1.54 | 51.0 |
| 125 | dry $Al_2O_3$ | 1.84 | 54.5 |
| 126 | dry $SiO_2$ | 1.54 | 48.4 |

Figure 24:
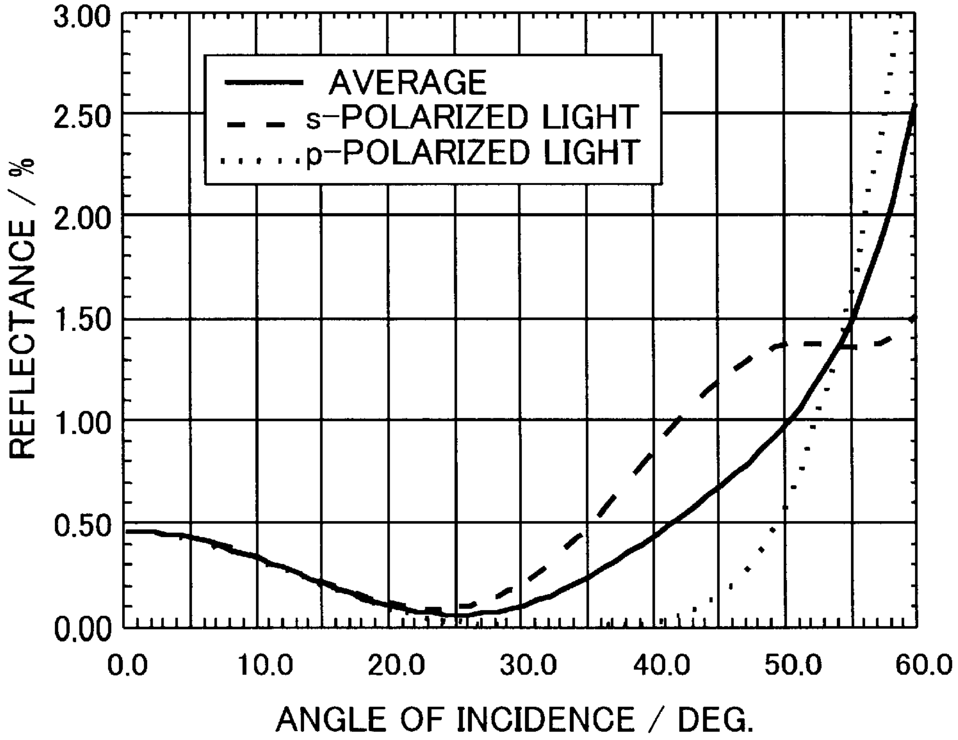
FIG. 24 shows results of measurement of angle-dependent characteristics of the reflectance obtained for the film structure concerning Comparative Example 4.

The reflection characteristics of the anti-reflection film obtained as described above were investigated as follows. The anti-reflection film was irradiated with the s-polarized light and the p-polarized light at the wavelength of193 nm at a variety of angles of incidence to measure the change of the reflectance with respect to the angle of incidence. Obtained results of the measurement are shown in FIG. 24. As clarified from FIG. 24, in the anti-reflection film of Comparative Example 4, the reflection is maintained to be not more than 0.5% within a range of the angle of incidence from 0 degree (perpendicular incidence) to 35 degrees. However, the reflection for the s-polarized light is extremely large at an angle of incidence of not less than 35 degrees. The reflection for the p-polarized light is extremely large at an angle of incidence of not less than 50 degrees, it exceeds the reflection for the s-polarized light at an angle of incidence of not less than 55 degrees, and it arrives at 3% at an angle of incidence of 58 degrees. The anti-reflection film produced in this example is applied to an optical element such as a lens part for the optical system. When the optical system is, for example, a projection lens for the semiconductor exposure having N.A. of not less than 0.8, the light, which has an angle of incidence up to about 60 degrees, generally comes into the respective lens parts incorporated into the projection lens to such an extent that the light is not negligible. Therefore, based on the reason explained in Comparative Example 1, it is difficult to apply the optical element provided with the anti-reflection film to any optical system such as a projection lens which satisfies N.A.≧0.8.

Ninth Embodiment

Figure 25:
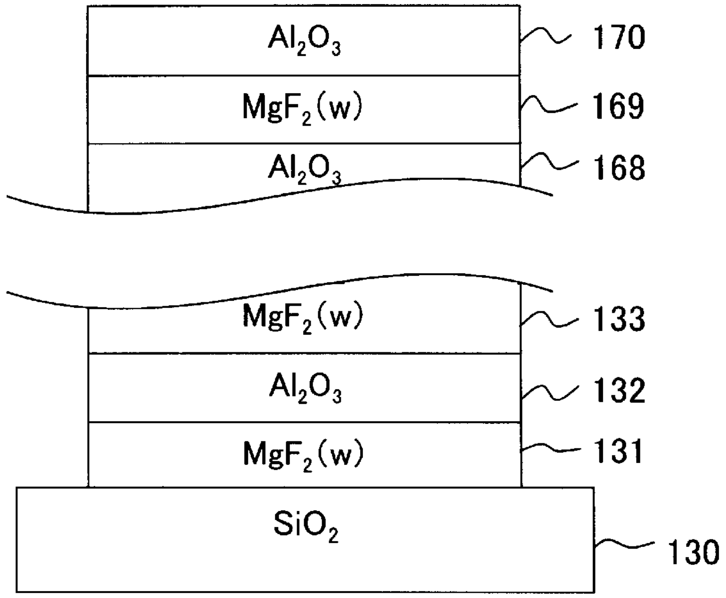
FIG. 25 shows a film structure according to a ninth embodiment of the present invention.

A reflection film is produced in this embodiment unlike the first to eighth embodiments. The reflection film is provided for the ArF excimer laser light beam (wavelength: 193 nm). The film arrangement is shown in Table 13, and the cross section of the film is shown in FIG. 25 on a synthetic quartz substrate 130 (refractive index: 1.56 at 193 nm). The medium is air. The reflection film of the present invention was formed to comprise $MgF_2$ films each having a low refractive index (hereinafter abbreviated as "L") formed by the wet process and $Al_2O_3$ films each having a high refractive index (hereinafter abbreviated as "H") formed by the dry process which were laminated in forty layers on the substrate repeatedly in this order as indicated by 131, 132, 133, . . . , 163, 169, 170. The $MgF_2$ film having the low refractive index has a refractive index of 1.17 and an optical thickness of 61 nm (0.31-fold of the designed central wavelength $\lambda_0$), and the $Al_2O_3$ film having the high refractive index has a refractive index of 1.84 and an optical thickness of 52 nm (0.27-fold of the designed central wavelength $\lambda_0$). The designed central wavelength $\lambda_0$ was selected to be 193 nm. This film arrangement is generally abbreviated as substrate/(LH)20.

The $MgF_2$ film based on the wet process was formed in accordance with the hydrofluoric acid/magnesium acetate method in the same manner as in the first embodiment. The $Al_2O_3$ thin film based on the dry process was formed by heating an $Al_2O_3$ material with an electron beam by using the EB vapor deposition method in the same manner as in the first embodiment.

TABLE 13

| Layer number | Film substance | Refractive index (193 nm) | Optical thickness/nm |
|---|---|---|---|
| 130 | substrate: quartz glass | | |
| 131 | dry $MgF_2$ | 1.17 | 60.5 |
| 132 | dry $Al_2O_3$ | 1.84 | 52.3 |
| 133 | wet $MgF_2$ | 1.17 | 60.5 |
| : | : | : | : |
| 168 | dry $Al_2O_3$ | 1.84 | 52.3 |
| 169 | wet $MgF_2$ | 1.17 | 60.5 |
| 170 | dry $Al_2O_3$ | 1.84 | 52.3 |

Figure 26:
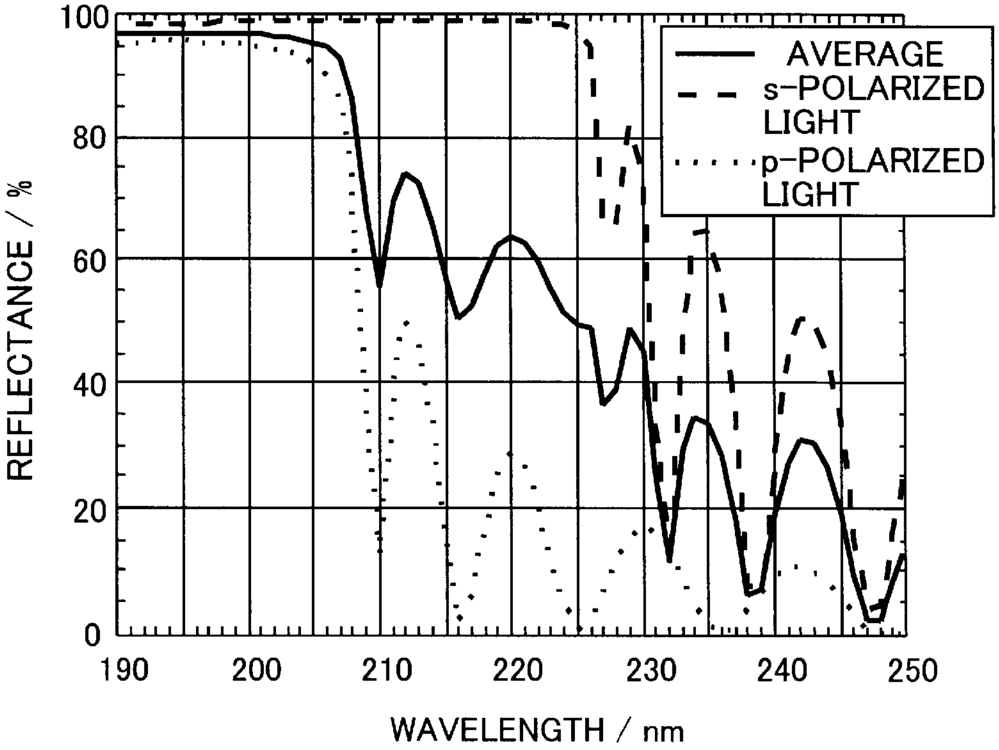
FIG. 26 shows results of measurement of the spectral reflectance obtained for the film structure according to the ninth embodiment.

Unlike the anti-reflection film, the reflection film is scarcely used in a wide range of the angle of incidence. Therefore, the reflectance was observed by using a constant angle of incidence of 45 degrees, while the wavelength of the incoming light beam was varied. Obtained results of the measurement of the spectral reflectance at the angle of incidence of 45 degrees are shown in FIG. 26, as represented by the reflectance obtained when the s-polarized light was radiated, the reflectance obtained when the p-polarized light was radiated, and the average reflectance thereof. According to FIG. 26, the reflection film of the present invention has an extremely high wavelength zone in which the reflectance is not less than 97%, i.e., a range from 190 nm or less to 226 nm with respect to the s-polarized light, a range from 190 nm or less to 204 nm with respect to the p-polarized light, and a range from 190 nm or less to 206 nm with respect to the average. Especially, the wavelength zone, in which the high reflectance is exhibited for the p-polarized light, is wide, i.e., not less than 14 nm. Although the reflectance in a wavelength region of not more than 190 nm is not illustrated on account of the wavelength range of the measured data, it is postulated that the wavelength zone, in which the high reflectance, i.e., the reflectance of not less than 97% is exhibited, is considerably wider than 14 nm.

Comparative Example 5

Figure 27:
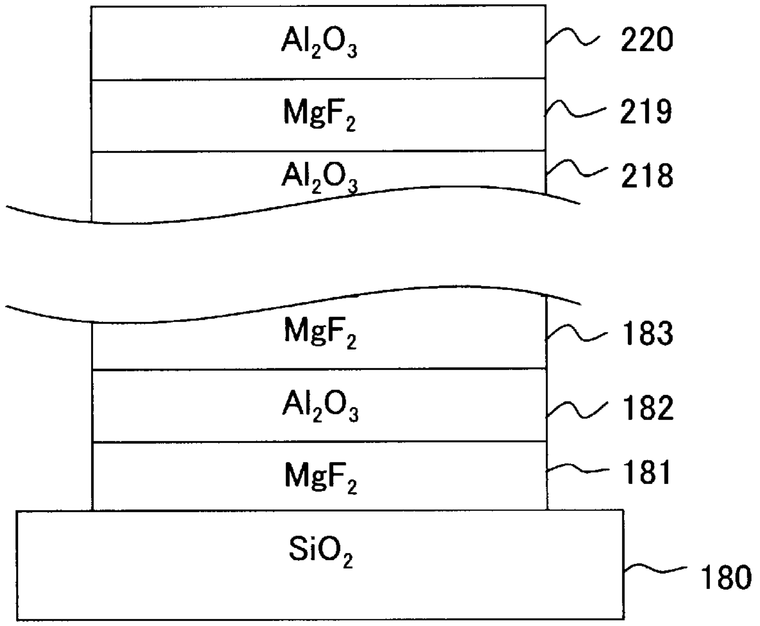
FIG. 27 shows a film structure concerning Comparative Example 5.

In Comparative Example 5, a reflection film for the ArF excimer laser light beam (wavelength: 193 nm) is produced. The film arrangement is shown in Table 14, and the cross section of the film is shown in FIG. 27 on a synthetic quartz substrate 180 (refractive index: 1.56 at 193 nm). The medium is air. The reflection film was formed to comprise $MgF_2$ films each having a low refractive index (hereinafter abbreviated as "L") formed by the dry process and $Al_2O_3$ films each having a high refractive index (hereinafter abbreviated as "H") formed by the dry process which were laminated in forty layers on the substrate repeatedly in this order as indicated by 181, 182, 183, . . . , 218, 219, 220. The $MgF_2$ film having the low refractive index has a refractive index of 1.43 and an optical thickness of 56 nm (0.29-fold of the designed central wavelength $\lambda_0$), and the $Al_2O_3$ film having the high refractive index has a refractive index of 1.84 and an optical thickness of 52 nm (0.27-fold of the designed central wavelength $\lambda_0$). The designed central wavelength $\lambda_0$ was selected to be 193 nm. This film arrangement is generally abbreviated as substrate/(LH)20.

TABLE 14

| Layer number | Film substance | Refractive index (193 nm) | Optical thickness/nm |
|---|---|---|---|
| 180 | substrate: quartz glass | | |
| 181 | dry $MgF_2$ | 1.43 | 55.9 |
| 182 | dry $Al_2O_3$ | 1.84 | 52.3 |
| 183 | dry $MgF_2$ | 1.43 | 55.9 |
| : | : | : | : |
| 218 | dry $Al_2O_3$ | 1.84 | 52.3 |
| 219 | dry $MgF_2$ | 1.43 | 55.9 |
| 220 | dry $Al_2O_3$ | 1.84 | 52.3 |

Figure 28:
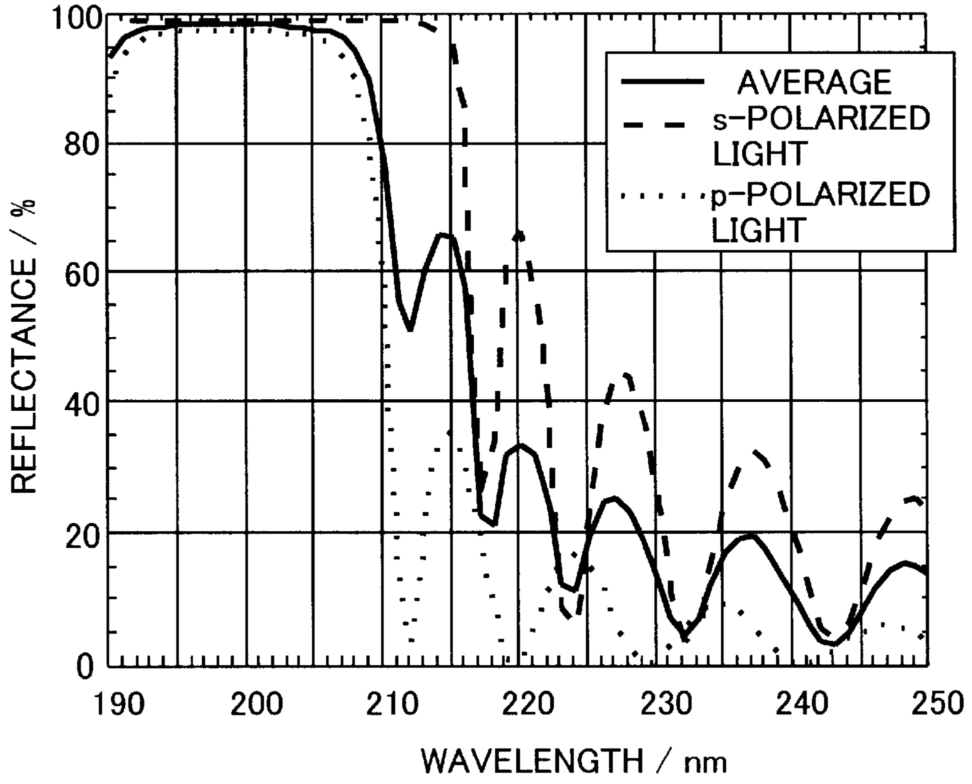
FIG. 28 shows results of measurement of the spectral reflectance obtained for the film structure concerning Comparative Example 5.

Results of the measurement of the spectral reflectance at the angle of incidence of 45 degrees for this reflection film are shown in FIG. 28, as represented by the reflectance obtained when the s-polarized light was radiated, the reflectance obtained when the p-polarized light was radiated, and the average reflectance thereof. According to FIG. 28, the reflection film has a wavelength zone in which the reflectance is not less than 97%, i.e., a range from 190 nm or less to 215 nm with respect to the s-polarized light, a range from 193 nm to 203 nm with respect to the p-polarized light, and a range from 191 nm to 206 nm with respect to the average. In any case, the wavelength zone is narrow as compared with the reflection film of the ninth embodiment. Especially, the region, in which the high reflectance is exhibited with respect to the p-polarized light, is narrow, i.e., 10 nm.

Tenth Embodiment

Figure 29:
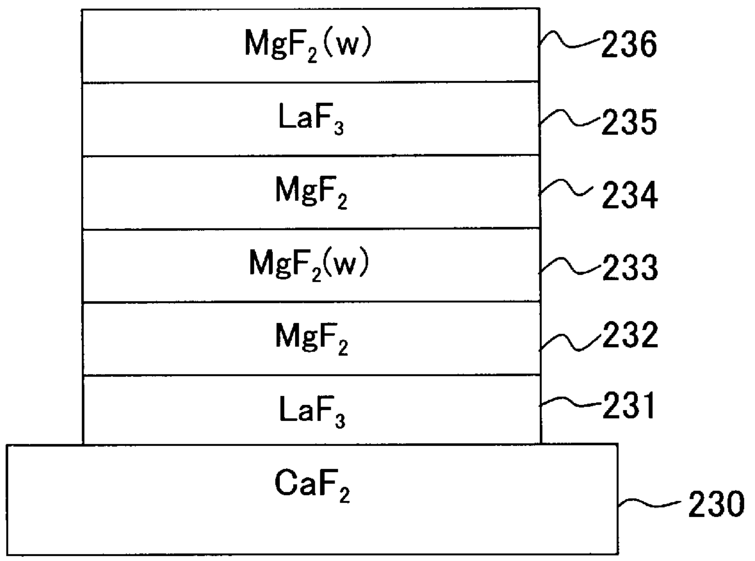
FIG. 29 shows a film structure according to a tenth embodiment of the present invention.

In the tenth embodiment, a six-layered anti-reflection film for the $F_2$ excimer laser light beam (wavelength: 157 nm) was produced. The film arrangement is shown in Table 15, and the cross section of the film is shown in FIG. 29 on a fluorite substrate 230 (refractive index: 1.56 at 157 nm). The medium is nitrogen. The first layer 231 is composed of dry process $LaF_3$ having a refractive index of 1.80 with respect to the light beam at the wavelength of 157 nm and an optical thickness of 68 nm (0.35-fold of the designed central wavelength $\lambda_0$). The second layer 232 is composed of dry process $MgF_2$ having a refractive index of 1.48 with respect to the light beam at the wavelength of 157 nm and an optical thickness of 25 nm (0.13-fold of the designed central wavelength $\lambda_0$) The third layer 233 is composed of wet process $MgF_2$ having a refractive index of 1.22 with respect to the light beam at the wavelength of 157 nm and an optical thickness of 63 nm (0.32-fold of the designed central wavelength $\lambda_0$). The fourth layer 234 is composed of dry process $MgF_2$ having a refractive index of 1.48 with respect to the light beam at the wavelength of 157 nm and an optical thickness of 52 nm (0.27-fold of the designed central wavelength $\lambda_0$). The fifth layer 235 is composed of dry process $LaF_3$ having a refractive index of 1.80 with respect to the light beam at the wavelength of 157 nm and an optical thickness of 8 nm (0.04-fold of the designed central wavelength $\lambda_0$). The sixth layer 236 is composed of wet process $MgF_2$ having a refractive index of 1.22 with respect to the light beam at the wavelength of 157 nm and an optical thickness of 42 nm (0.22-fold of the designed central wavelength $\lambda_0$). In this case, the designed central wavelength $\lambda_0$ is a wavelength to serve as the reference for the designed film thickness, for which 157 nm was selected. The anti-reflection film includes the third layer and the sixth layer as the uppermost layer which are formed in accordance with the wet process. In the dry process, the EB vapor deposition method was used in the same manner as in the first embodiment.

TABLE 15

| Layer number | Film substance | Refractive index (157 nm) | Optical thickness/nm |
|---|---|---|---|
| 230 | | substrate: fluorite | |
| 231 | dry $LaF_3$ | 1.80 | 67.5 |
| 232 | dry $MgF_2$ | 1.48 | 24.5 |
| 233 | wet $MgF_2$ | 1.22 | 62.6 |
| 234 | dry $MgF_2$ | 1.48 | 52.1 |
| 235 | dry $LaF_3$ | 1.80 | 7.7 |
| 236 | wet $MgF_2$ | 1.22 | 42.4 |

Figure 30:
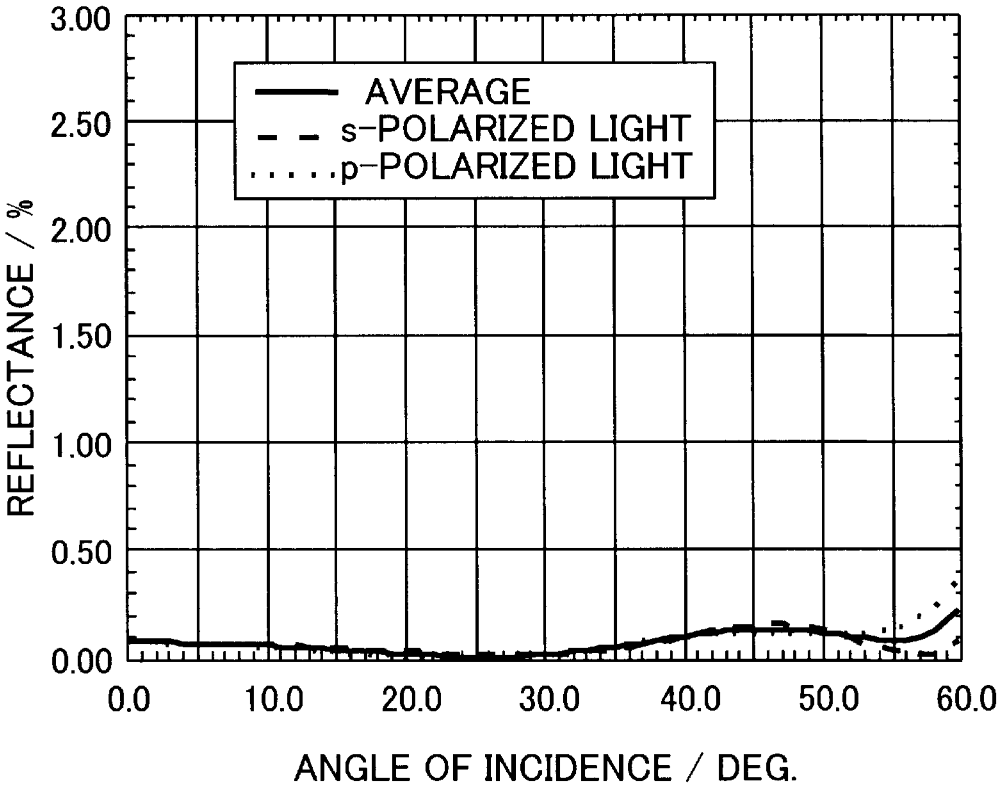
FIG. 30 shows results of measurement of angle-dependent characteristics of the reflectance obtained for the film structure according to the tenth embodiment.

The reflection characteristics of the anti-reflection film obtained as described above were investigated as follows. The anti-reflection film was irradiated with the s-polarized light and the p-polarized light at the wavelength of 157 nm at a variety of angles of incidence to measure the change of the reflectance with respect to the angle of incidence. Obtained results of the measurement are shown in FIG. 30. As clarified from FIG. 30, although the anti-reflection film of the present invention has the relatively small number of layers, i.e., six layers, any one of the reflectances for the s-polarized light and the p-polarized light and the average reflectance thereof was not more than 0.2% in a range of the angle of incidence from 0 degree (perpendicular incidence) to 56 degrees. Therefore, the difference in reflectance, which is caused by the difference in polarization, is extremely small. The characteristic, in which the reflection is favorably low and the reflection does not depend on the polarization, is still maintained at an angle of incidence of 60 degrees exceeding 56 degrees.

Eleventh Embodiment

Figure 31:
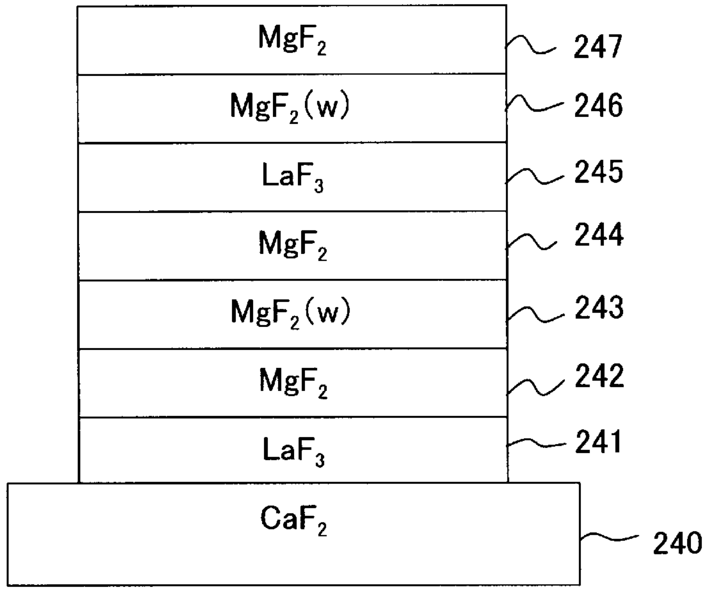
FIG. 31 shows a film structure according to an eleventh embodiment of the present invention.

In the eleventh embodiment, a seven-layered anti-reflection film for the ArF excimer laser light beam (wavelength: 157 nm) was produced. The film arrangement is shown in Table 16, and the cross section of the film is shown in FIG. 31 on a fluorite substrate 240 (refractive index: 1.56 at 157 nm). The medium is nitrogen. The first layer 241 is composed of dry process $LaF_3$ having a refractive index of 1.80 with respect to the light beam at the wavelength of 157 nm and an optical thickness of 68 nm (0.35-fold of the designed central wavelength $\lambda_0$). The second layer 242 is composed of dry process $MgF_2$ having a refractive index of 1.48 with respect to the light beam at the wavelength of 157 nm and an optical thickness of 24 nm (0.13-fold of the designed central wavelength $\lambda_0$). The third layer 243 is composed of wet process $MgF_2$ having a refractive index of 1.22 with respect to the light beam at the wavelength of 157 nm and an optical thickness of 62 nm (0.32-fold of the designed central wavelength $\lambda_0$). The fourth layer 244 is composed of dry process $MgF_2$ having a refractive index of 1.48 with respect to the light beam at the wavelength of 157 nm and an optical thickness of 50 nm (0.26-fold of the designed central wavelength $\lambda_0$). The fifth layer 245 is composed of dry process $LaF_3$ having a refractive index of 1.80 with respect to the light beam at the wavelength of 157 nm and an optical thickness of 10 nm (0.05-fold of the designed central wavelength $\lambda_0$). The sixth layer 246 is composed of wet process $MgF_2$ having a refractive index of 1.22 with respect to the light beam at the wavelength of 157 nm and an optical thickness of 38 nm (0.19-fold of the designed central wavelength $\lambda_0$). The seventh layer 247 is composed of dry process $MgF_2$ having a refractive index of 1.48 with respect to the light beam at the wavelength of 157 nm and an optical thickness of 3 nm (0.02-fold of the designed central wavelength $\lambda_0$). The designed central wavelength $\lambda_0$ was selected to be 157 nm.

The anti-reflection film includes the third layer and the sixth layer which are formed in accordance with the wet process. The $MgF_2$ thin film based on the wet process was formed in accordance with the hydrofluoric acid/magnesium acetate method in the same manner as in the first embodiment. The thin film based on the dry process was formed by using the EB vapor deposition method in the same manner as in the first embodiment.

TABLE 16

| Layer number | Film substance | Refractive index (157 nm) | Optical thickness/nm |
|---|---|---|---|
| 240 | | substrate: fluorite | |
| 241 | dry $LaF_3$ | 1.80 | 68.1 |
| 242 | dry $MgF_2$ | 1.48 | 24.4 |
| 243 | wet $MgF_2$ | 1.22 | 62.1 |
| 244 | dry $MgF_2$ | 1.48 | 50.4 |
| 245 | dry $LaF_3$ | 1.80 | 9.5 |
| 246 | wet $MgF_2$ | 1.22 | 37.5 |
| 247 | dry $MgF_2$ | 1.48 | 3.0 |

Figure 32:
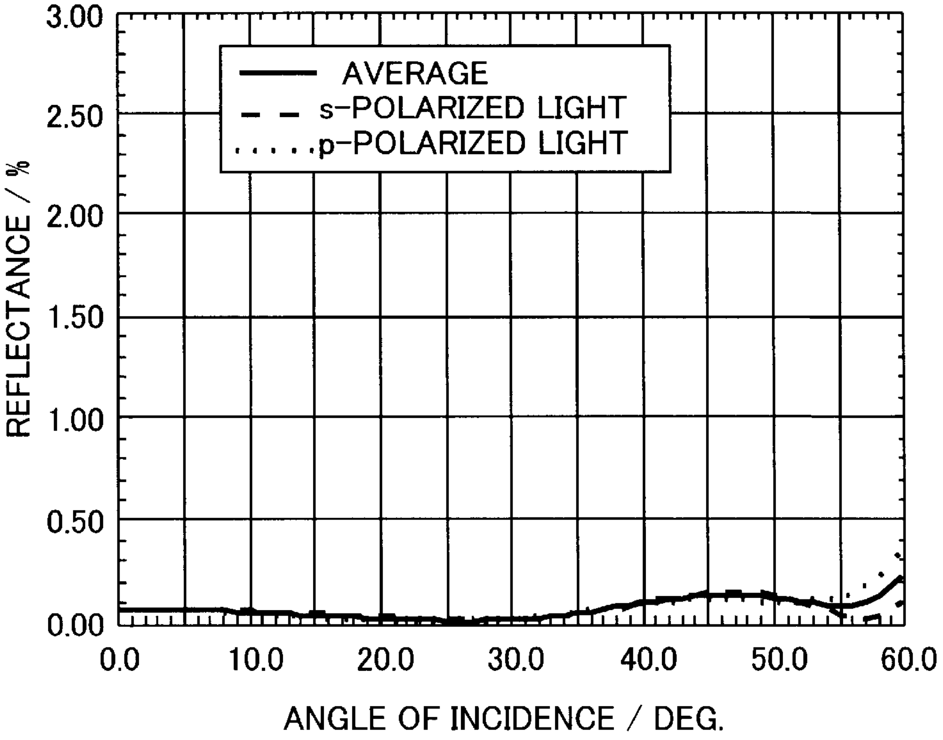
FIG. 32 shows results of measurement of angle-dependent characteristics of the reflectance obtained for the film structure according to the eleventh embodiment.

The reflection characteristics of the anti-reflection film obtained as described above were investigated as follows. The anti-reflection film was irradiated with the s-polarized light and the p-polarized light at the wavelength of 157 nm at a variety of angles of incidence to measure the change of the reflectance with respect to the angle of incidence. Obtained results of the measurement are shown in FIG. 32. As clarified from FIG. 32, although the anti-reflection film of the present invention has the relatively small number of layers, i.e., seven layers, any one of the reflectances for the s-polarized light and the p-polarized light and the average reflectance thereof was not more than 0.2% in a range of the angle of incidence from 0 degree (perpendicular incidence) to 56 degrees. Therefore, the difference in reflectance, which is caused by the difference in polarization, is extremely small. The characteristic, in which the reflection is favorably low and the reflection does not depend on the polarization, is still maintained at an angle of incidence of 60 degrees exceeding 56 degrees.

Comparative Example 6

Figure 33:
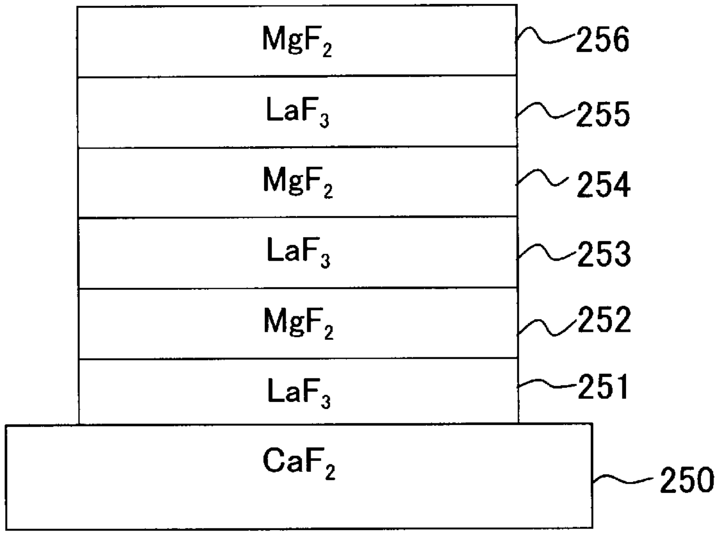
FIG. 33 shows a film structure concerning Comparative Example 6.

In Comparative Example 6, a six-layered anti-reflection film for the excimer laser light beam (wavelength: 157 nm) was produced. The film arrangement is shown in Table 17, and the cross section of the film is shown in FIG. 33 on a fluorite substrate 250 (refractive index: 1.56 at 157 nm). The medium is nitrogen. The first layer 251 is composed of $LaF_3$ having a refractive index of 1.80 with respect to the light beam at the wavelength of 157 nm and an optical thickness of 72 nm (0.37-fold of the designed central wavelength $\lambda_0$). The second layer 252 is composed of $MgF_2$ having a refractive index of 1.48 with respect to the light beam at the wavelength of 157 nm and an optical thickness of 55 nm (0.28-fold of the designed central wavelength $\lambda_0$). The third layer 253 is composed of $LaF_3$ having a refractive index of 1.80 with respect to the light beam at the wavelength of 157 nm and an optical thickness of 72 nm (0.37-fold of the designed central wavelength $\lambda_0$). The fourth layer 254 is composed of $MgF_2$ having a refractive index of 1.48 with respect to the light beam at the wavelength of 157 nm and an optical thickness of 44 nm (0.23-fold of the designed central wavelength $\lambda_0$). The fifth layer 255 is composed of $LaF_3$ having a refractive index of 1.80 with respect to the light beam at the wavelength of 157 nm and an optical thickness of 44 nm (0.23-fold of the designed central wavelength $\lambda_0$). The sixth layer 256 is composed of $MgF_2$ having a refractive index of 1.48 with respect to the light beam at the wavelength of 157 nm and an optical thickness of 40 nm (0.21-fold of the designed central wavelength $\lambda_0$). The designed central wavelength $\lambda_0$ was selected to be 157 nm.

All of the six layers of the anti-reflection film were formed by means of the dry process based on the EB vapor deposition method used in the first embodiment.

TABLE 17

| Layer number | Film substance | Refractive index (157 nm) | Optical thickness/nm |
|---|---|---|---|
| 250 | | substrate: fluorite | |
| 251 | dry $LaF_3$ | 1.80 | 72.3 |
| 252 | dry $MgF_2$ | 1.48 | 54.7 |
| 253 | dry $LaF_3$ | 1.80 | 71.6 |
| 254 | dry $MgF_2$ | 1.48 | 44.4 |
| 255 | dry $LaF_3$ | 1.80 | 43.9 |
| 256 | dry $MgF_2$ | 1.48 | 40.2 |

Figure 34:
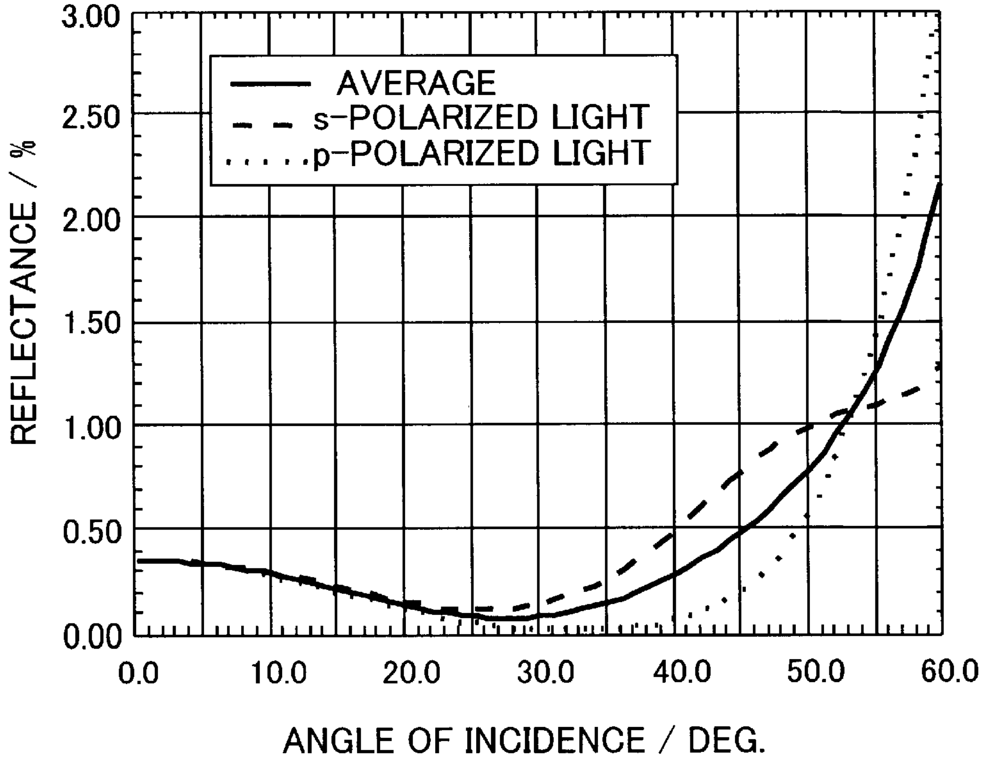
FIG. 34 shows results of measurement of angle-dependent characteristics of the reflectance obtained for the film structure concerning Comparative Example 6.

The reflection characteristics of the anti-reflection film obtained as described above were investigated as follows. The anti-reflection film was irradiated with the s-polarized light and the p-polarized light at the wavelength of 157 nm at a variety of angles of incidence to measure the change of the reflectance with respect to the angle of incidence. Obtained results of the measurement are shown in FIG. 34. As clarified from FIG. 34, in the anti-reflection film of Comparative Example 6, the reflection is maintained to be not more than 0.5% within a range of the angle of incidence from 0 degree (perpendicular incidence) to 40 degrees. However, the difference in anti-reflection characteristic between the p-polarized light and the s-polarized light is increased from an angle of incidence in the vicinity of 30 degrees. Further, the reflection for the p-polarized light also exceeds 0.5% at an angle of incidence of not less than 50 degrees, it exceeds the reflection for the s-polarized light at an angle of incidence of not less than 53 degrees, and it arrives at 3% at an angle of incidence of 59 degrees. The anti-reflection film produced in this example is applied to an optical element such as a lens part for the optical system. When the optical system is, for example, a projection lens for the semiconductor exposure having N.A. of not less than 0.8, the light, which has an angle of incidence up to about 60 degrees, generally comes into the respective lens parts incorporated into the projection lens to such an extent that the light is not negligible. Based on the reason explained in Comparative Example 1, it is difficult to apply the optical element provided with the anti-reflection film to any optical system such as a projection lens which satisfies N.A.$\geqq$0.8.

As explained above, the anti-reflection films produced in the first to eighth embodiments and the tenth and eleventh embodiments are effective for the use in the ultraviolet region of not more than 300 nm, in which the total number of layers is small, and the low reflectance characteristic, the wide angle-dependent characteristic, and the small difference in polarization characteristic are exhibited. The reflection film produced in the ninth embodiment exhibits the high reflectance characteristic and the wide high reflectance wavelength region in the wavelength region of not more than 300 nm. Therefore, when at least one of these multi-layered optical thin films is applied to the optical system such as the projection lens, the optical system having the high optical performance of N.A.$\geqq$0.8, which has been extremely difficult to be realized in the conventional technique, is obtained. Further, when the optical system is used for the optical apparatus such as the semiconductor exposure apparatus, the high performance optical apparatus is obtained.

Example of Application to Exposure Apparatus

Figure 35:
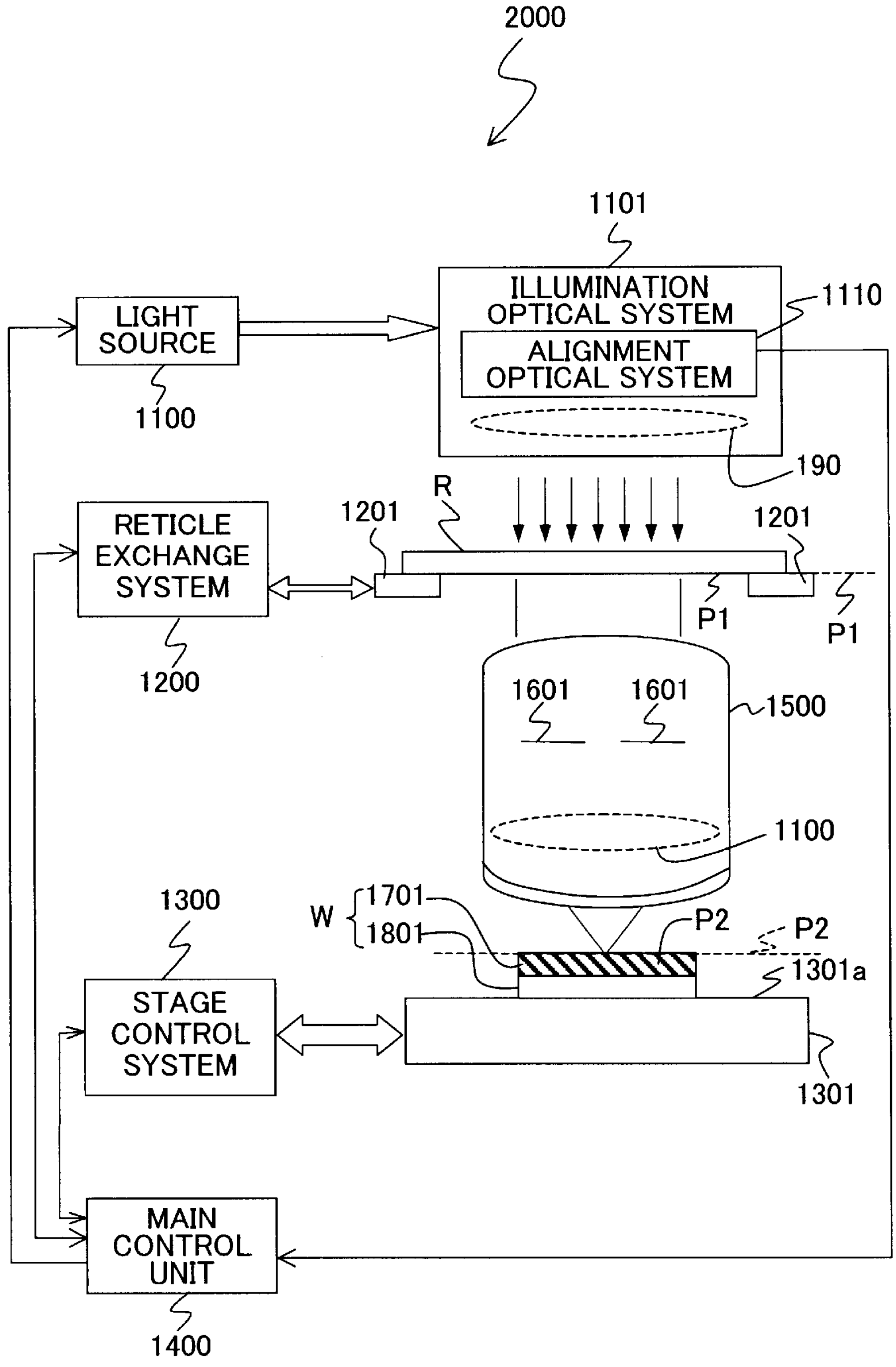
FIG. 35 shows a basic arrangement of an exposure apparatus according to the present invention.

Next, an example of the exposure apparatus based on the use of the optical element of the present invention will be explained with reference to FIG. 35. FIG. 35 conceptually illustrates a scanning type projection exposure apparatus 2000 for exposing a wafer 1801 (W as a whole) coated with photoresist 1701 with an image of a pattern on a reticle R. The optical element produced in any one of the first to eleventh embodiments is applied to the exposure apparatus.

As shown in FIG. 35, the projection exposure apparatus of the present invention comprises at least a reticle stage 1201 which is movable in a direction parallel to the surface of the reticle R while holding the reticle R (mask), a wafer stage 1301 which is movable in a direction parallel to the wafer surface while holding the wafer (substrate) W on a surface 1301*a,* an illumination optical system 1101 which is provided to irradiate the reticle R (mask) with a vacuum ultraviolet light beam, a light source 1100 which is provided to supply the vacuum ultraviolet light beam as the exposure light beam to the illumination optical system 1101, and a projection optical system 1500 which is provided to project the image of the pattern on the reticle R onto the wafer W. The projection optical system 1500 is arranged between the reticle R and the wafer W so that the surface P1 on which the reticle R is arranged serves as the object plane, and the surface p2 of the wafer W serves as the image plane. The illumination optical system 1101 includes an alignment optical system 1110 for performing relative positional adjustment for the reticle R and the wafer W. A reticle exchange system 1200 exchanges and transports the reticle R set to the reticle stage 1201. The reticle exchange system 1200 includes a reticle stage driver (not shown) for moving the reticle stage 1201. A stage control system 1300 is provided with a wafer stage driver (not shown) for moving the wafer stage 1301. A main control system 1400 controls the reticle stage driver and the wafer stage driver by the aid of the stage control system 1300 to drive the reticle stage and the wafer stage so that they are synchronously moved with respect to the exposure light beam. The projection optical system 1500 further includes an alignment optical system 1601.

In the exposure apparatus 2000, it is possible to use the optical element coated with the multilayered film including the $MgF_2$ film produced in the embodiment as described above. Specifically, the optical elements produced in the first to eighth embodiments and the tenth and eleventh embodiments can be used for the optical lens 190 of the illumination optical system 1101 and the projection lens 1100 of the projection optical system 1500. Usually, a plurality of projection lenses 1100 are arranged in the projection optical system 1500. Especially, it is preferable that the lens, which is disposed on the light-outgoing side, i.e., at the position closest to the wafer W, is the lens according to the present invention. In this case, the multilayered film may be applied to only the light-incoming plane of the projection lens. Alternatively, the multilayered film may be applied to the entire lens. Further, the optical elements are used in the exposure apparatus, including, for example, the fly's eye lens, the various relay lenses, the beam splitter, the condenser lens, the beam expander, and the reflecting mirror. However, the present invention is applicable to any element.

FIG. 35 is illustrative of the scanning type projection exposure apparatus. However, the present invention is not limited thereto. The present invention is also applicable to the projection exposure apparatus based on the step-and-repeat system (so-called stepper), the mirror projection aligner, and the proximity type exposure apparatus. The optical element equipped with the reflection film produced in the tenth embodiment can be applied, for example, to a reflecting plate to be used for the exposure apparatus having the projection optical system based on the reflecting system or the cata-dioptric system. The projection exposure apparatus and the optical elements used therefor are disclosed in U.S. Pat. No. 5,835,275. This patent document is incorporated herein by reference so long as the domestic laws and ordinances of the designated state permit the incorporation.

Further, the optical element of the present invention is usable for various apparatuses other than the exposure apparatus, including, for example, spectroscopes, laser repair apparatuses, various inspection apparatuses, and sensors.

INDUSTRIAL APPLICABILITY

The multilayered film of the optical element according to the present invention has the film which exhibits the extremely low refractive index of not more than 1.35, especially not more than 1.20 in the vacuum ultraviolet region of not more than 250 nm. Therefore, it is possible to increase the difference in refractive index between the high refractive index film and the low refractive index film in the multilayered film, and it is possible to decrease the refractive index of the low refractive index film. Accordingly, it is possible to obtain the optical element provided with the anti-reflection film in which the number of layers is small, the reflectance is low, the angle-dependent characteristic is wide, and the difference in polarization characteristic is small or the reflection film in which the number of layers is small, the reflectance is high, and the high reflectance wavelength region is wide, as well as the exposure apparatus based on the use of the optical element, for the use in the ultraviolet region of not more than 300 nm, especially in the vacuum ultraviolet region of not more than 250 nm. Therefore, the present invention is extremely useful especially for the exposure apparatus based on the use of the optical element which satisfies N.A.$\geqq$0.8 in order to realize the exposure for a superfine pattern based on the use of the photolithography.

What is claimed is:

1. An optical element comprising:

an optical substrate; and a multilayered optical thin film which is formed on the optical substrate, wherein:

at least one layer of the multilayered optical thin film is composed of fluoride of alkaline earth metal and is formed by a wet process;

a refractive index of the at least one layer of the multilayered optical thin film with respect to a light beam having a wavelength of not more than 250 nm is not more than 1.35, and the multilayered optical thin film is an anti-reflection film, and a reflectance is not more than 0.5% with respect to the light beam having a wavelength selected from the group consisting of wavelengths of 157 nm, 193 nm, and 248 nm, provided that an angle of incidence is not more than 50 degrees.

2. An optical element comprising:

an optical substrate; and a multilayered optical thin film which is formed on the optical substrate, wherein:

at least one layer of the multilayered optical thin film is composed of fluoride of alkaline earth metal and is formed by a wet process, a refractive index of the at least one layer of the multilayered optical thin film with respect to a light beam having a wavelength of not more than 250 nm is not more than 1.35, and a reflectance is not more than 0.2% with respect to the light beam having the wavelength selected from the group consisting of the wavelengths of 157 nm, 193 nm, and 248 nm, provided that the angle of incidence is not more than 55 degrees.

3. An optical element comprising:

an optical substrate; and a muiltilayered optical thin film which is formed on the optical substrate, wherein:

at least one layer of the multilayered optical thin film is composed of fluoride of alkaline earth metal and is formed by a wet process, a refractive index of the at least one layer of the multilayered optical thin film with respect to a light beam having a wavelength of not more than 250 nm is not more than 1.35, and the multilayered optical thin film is a reflection film, and a reflectance is not less than 97% with respect to the light beam having a wavelength of 193 nm.

4. An optical element, the optical element being a projection lens to be used for a projection exposure apparatus and comprising:

an optical substrate; and a multilayered optical thin film which is formed on the optical substrate, wherein:

at least one layer of the multilayered optical thin film is composed of fluoride of alkaline earth metal and is formed by a wet process, and a refractive index of the at least one layer of the multilayered optical thin film with respect to a light beam having a wavelength of not more than 250 nm is less than 1.35.

5. The optical element according to claim 4, wherein N.A.≧0.80 is satisfied.

6. An exposure apparatus for exposing a substrate with an image of a pattern on a mask, the exposure apparatus comprising:

an illumination optical system which illuminates the mask with a vacuum ultraviolet light beam;

a projection optical system which includes an optical element and which projects the image of the pattern on the mask onto the substrate; and a multilayered optical thin film which is formed on a surface of the optical element, wherein:

at least one layer of the multilayered optical thin film is composed of fluoride of alkaline earth metal and is formed by a wet process; and a refractive index of the at least one layer with respect to a light beam having a wavelength of not more than 250 nm is less than 1.35.

7. The exposure apparatus according to claim 6, wherein the refractive index of the at least one layer of the multilayered optical thin film with respect to the light beam having the wavelength of not more than 250 nm is 1.15 to 1.25.

8. The exposure apparatus according to claim 6, wherein the multilayered optical thin film is an anti-reflection film, and the anti-reflection film has a reflectance which is not more than 0.5% with respect to the light beam having a wavelength selected from the group consisting of wavelengths of 157 nm, 193 nm, and 248 nm, provided that an angle of incidence is not more than 55 degrees.

9. The exposure apparatus according to claim 6, wherein the optical element is a projection lens or a reflecting plate.

10. The exposure apparatus according to claim 6, wherein the vacuum ultraviolet light beam has a wavelength of not more than 250 nm.

11. An exposure apparatus for exposing a substrate with an image of a pattern on a mask, the exposure apparatus comprising:

an illumination optical system which includes an optical element and which illuminates the mask with a vacuum ultraviolet light beam;

a projection optical system which projects the image of the pattern on the mask onto the substrate; and a multilayered optical thin film which is formed on a surface of the optical element, wherein:

at least one layer of the multilayered optical thin film is composed of fluoride of alkaline earth metal and is formed by a wet process; and a refractive index of the at least one layer with respect to a light beam having a wavelength of not more than 250 nm is less than 1.35.

12. The exposure apparatus according to claim 11, wherein the projection optical system includes at least one projection lens, a multilayered optical thin film is formed on a surface of the projection lens, and a refractive index of at least one layer of the multilayered optical thin film with respect to a light beam having a wavelength of not more than 250 nm is not more than 1.35.

13. The exposure apparatus according to claim 11, wherein the refractive index of the at least one layer of the multilayered optical thin film with respect to the light beam having the wavelength of not more than 250 nm is 1.15 to 1.25.

14. The exposure apparatus according to claim 11, wherein the multilayered optical thin film is an anti-reflection film, and the anti-reflection film has a reflectance which is not more than 0.5% with respect to the light beam having a wavelength selected from the group consisting of wavelengths of 157 nm, 193 nm, and 248 nm, provided that an angle of incidence is not more than 55 degrees.

15. The exposure apparatus according to claim 11, wherein the vacuum ultraviolet light beam has a wavelength of not more than 250 nm.

* * * * *